United States Patent [19]
Fujihira et al.

[11] Patent Number: 6,124,628
[45] Date of Patent: *Sep. 26, 2000

[54] HIGH VOLTAGE INTEGRATED CIRCUIT, HIGH VOLTAGE JUNCTION TERMINATING STRUCTURE, AND HIGH VOLTAGE MIS TRANSISTOR

[75] Inventors: Tatsuhiko Fujihira; Yukio Yano; Shigeyuki Obinata; Naoki Kumagai, all of Nagano, Japan

[73] Assignee: Fuji Electric Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/631,017

[22] Filed: Apr. 12, 1996

[30] Foreign Application Priority Data

| Apr. 12, 1995 | [JP] | Japan | 7-86601 |
| Jun. 8, 1995 | [JP] | Japan | 7-141469 |
| Jul. 28, 1995 | [JP] | Japan | 7-192891 |

[51] Int. Cl.[7] .......................... H01L 29/78; H01L 33/00
[52] U.S. Cl. ...................... 257/630; 257/648; 257/354
[58] Field of Search ................................. 257/630, 648, 257/354, 400

[56] References Cited

U.S. PATENT DOCUMENTS

| 3,845,495 | 10/1974 | Cauge et al. . | |
| 4,315,781 | 2/1982 | Henderson . | |
| 5,040,045 | 8/1991 | McArther et al. . | |
| 5,083,179 | 1/1992 | Chong et al. . | |
| 5,237,193 | 8/1993 | Williams et al. . | |
| 5,306,939 | 4/1994 | Mitani et al. . | |
| 5,497,023 | 3/1996 | Nakazato et al. | 257/394 |
| 5,545,911 | 8/1996 | Otsuki et al. | 257/400 |
| 5,801,418 | 9/1998 | Ranjan | 257/336 |

FOREIGN PATENT DOCUMENTS

| 0576001 | 12/1993 | European Pat. Off. . |
| 0594111A | 4/1994 | European Pat. Off. . |
| 0613187A | 8/1994 | European Pat. Off. . |
| 0614222 | 9/1994 | European Pat. Off. . |
| 60160651A | 8/1985 | Japan . |
| 2121601A | 12/1993 | United Kingdom . |
| WO 9416462 | 7/1994 | WIPO . |

OTHER PUBLICATIONS

Rossel et al., "Smart Power and High Voltage Integrated Circuits and Related MOS Technologies" Microelectronics Journal, vol. 20, No. 1/02, Mar. 21, 1999.

Rossel et al., "MOS Technologies for Smart Power & High–Voltage Circuits", Onde Electrique, vol. 67, Nov. 1987.

Korec J. et al., "Comparison of DMOS/IGBT Compatible High–Voltage Termination Structures and Passivation Techniques", IEEE Transactions on Electron Device vol. 40, No. 10, Oct. 1, 1993, pp 1845–1854.

Amato, M., "Reduced Electric Field Crowding at the Fingertips of Lateral DMOS Transistors", Extended Abstracts, vol. 87–1, No. 1, 1987, pp 161–162.

Liu, C. T. et al., "High–Performance CMOS With Oxidation–Planarized Twin Tubs and One–Mask Sealed Diffusion–Junctions", Proc. of the Internation Electron Devices Meeting, Washington, Dec. 5, 1993, pp 437–440.

*Primary Examiner*—Stephen D. Meier
*Attorney, Agent, or Firm*—Rossi & Associates

[57] ABSTRACT

A high voltage integrated circuit is provided that includes a first region of first conductivity type; a second region of second conductivity type formed in a first major surface of the first region; a third region of first conductivity type formed in a selected area of a surface of the second region; first source region and first drain region of the first conductivity type formed in the second region, apart from the third region; a first gate electrode formed on a surface of the second region between the first source region and first drain region, through an insulating film; second source region and second drain region of second conductivity type formed in a surface of the third region; and a second gate electrode formed on a surface of the third region between the second source region and the second drain region, through an insulating film.

16 Claims, 33 Drawing Sheets

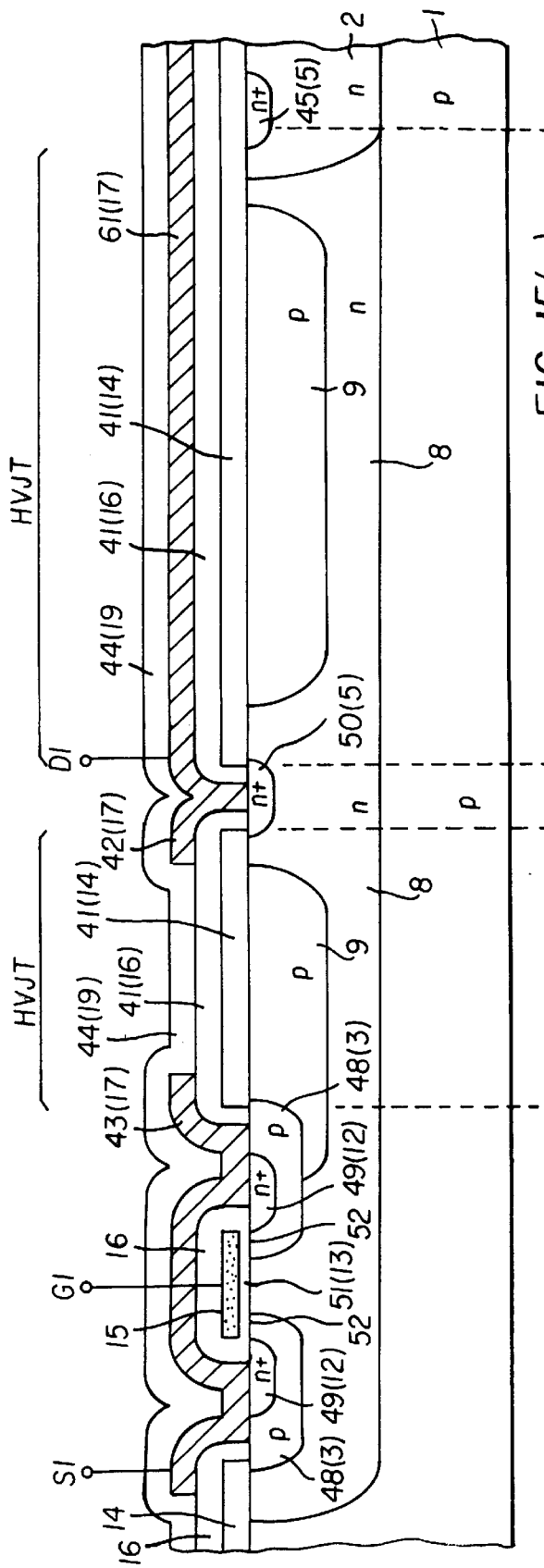

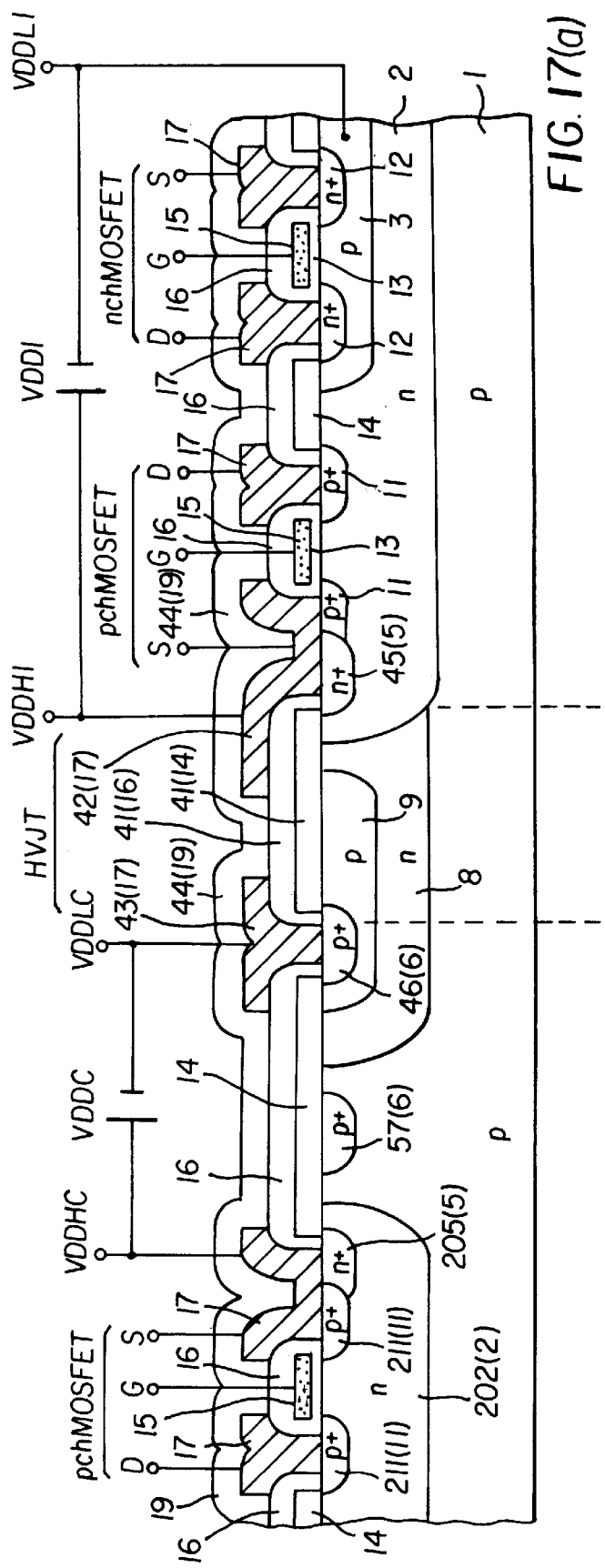
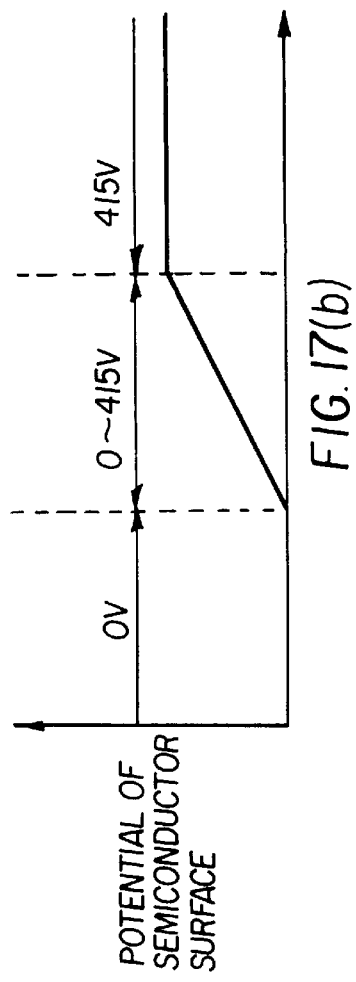
FIG. 17(a)
FIG. 17(b)

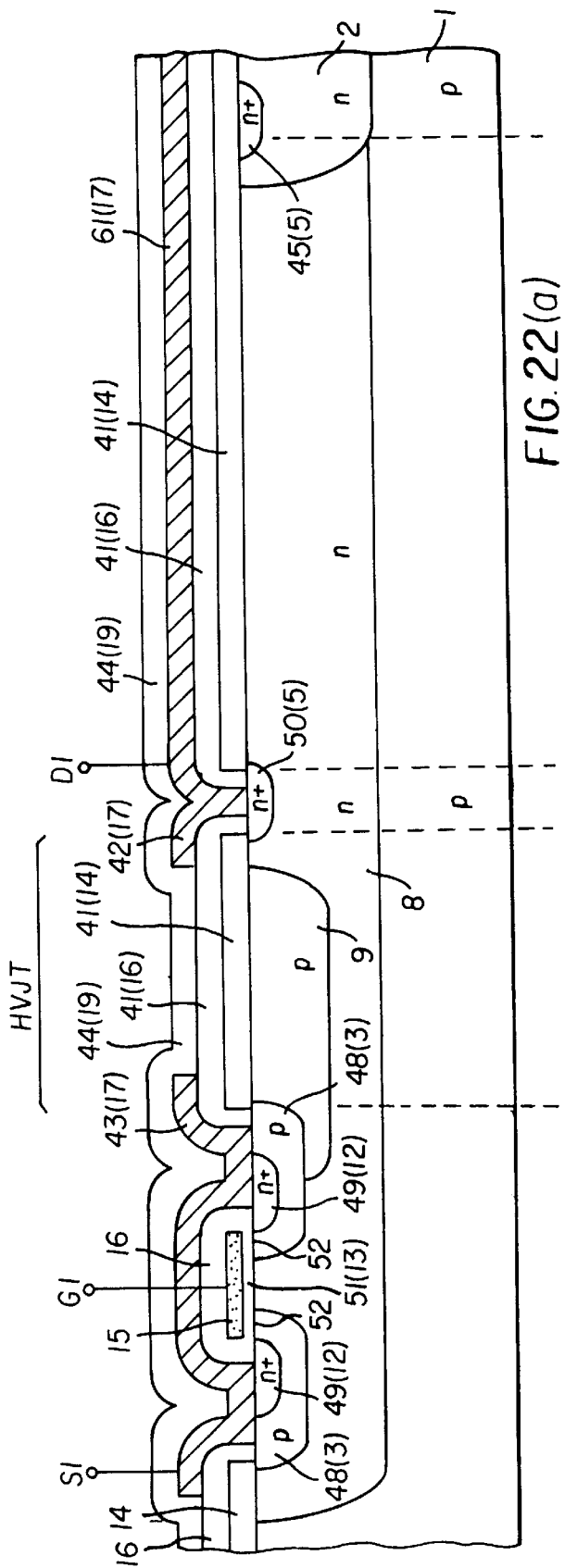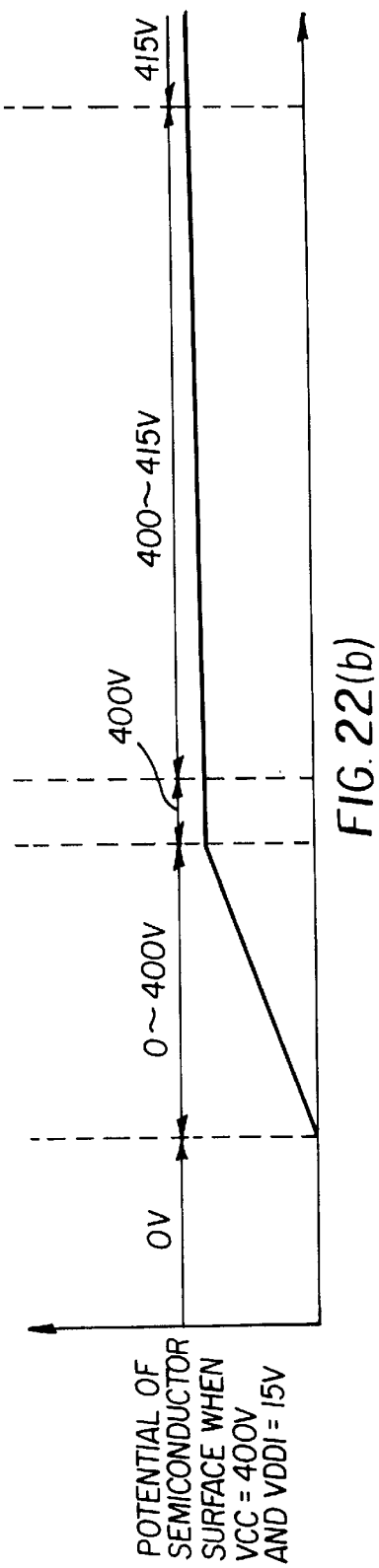
FIG. 22(a)
FIG. 22(b)

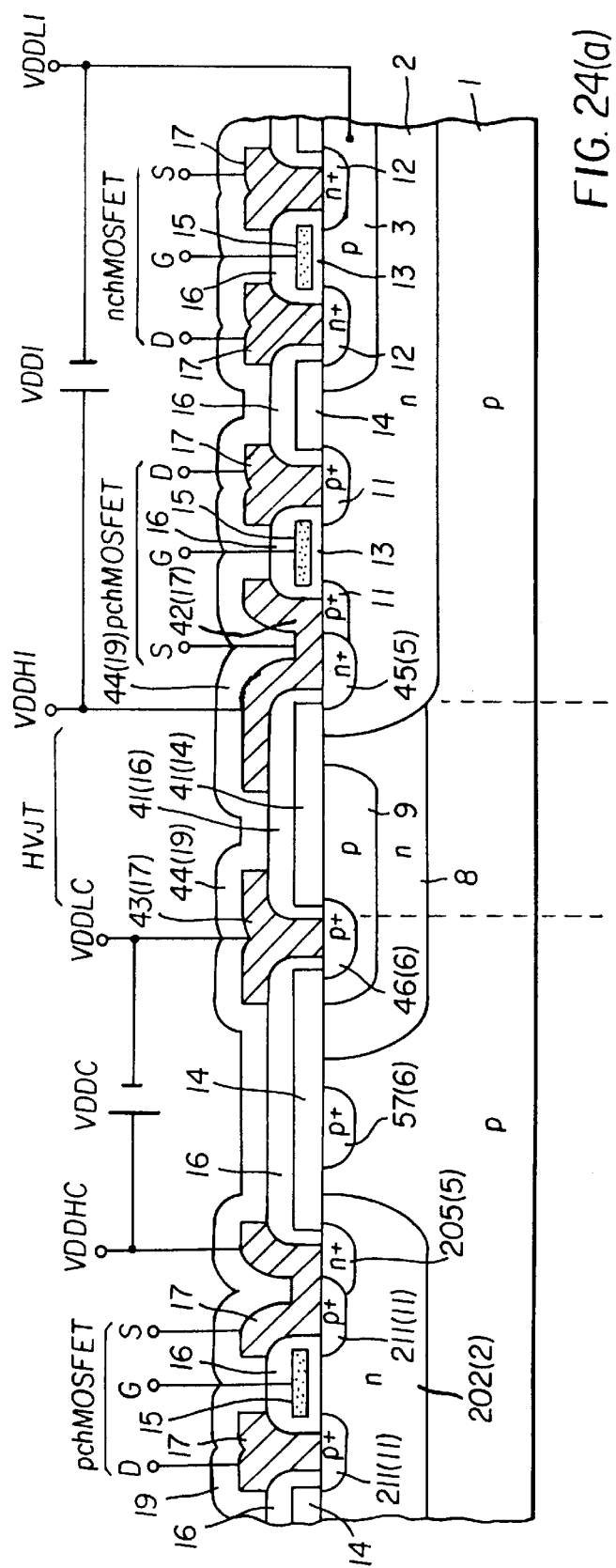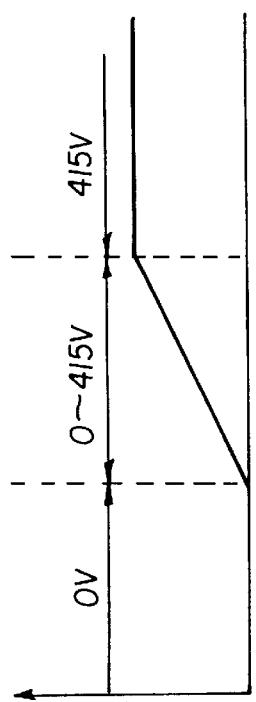
FIG. 24(a)
FIG. 24(b)

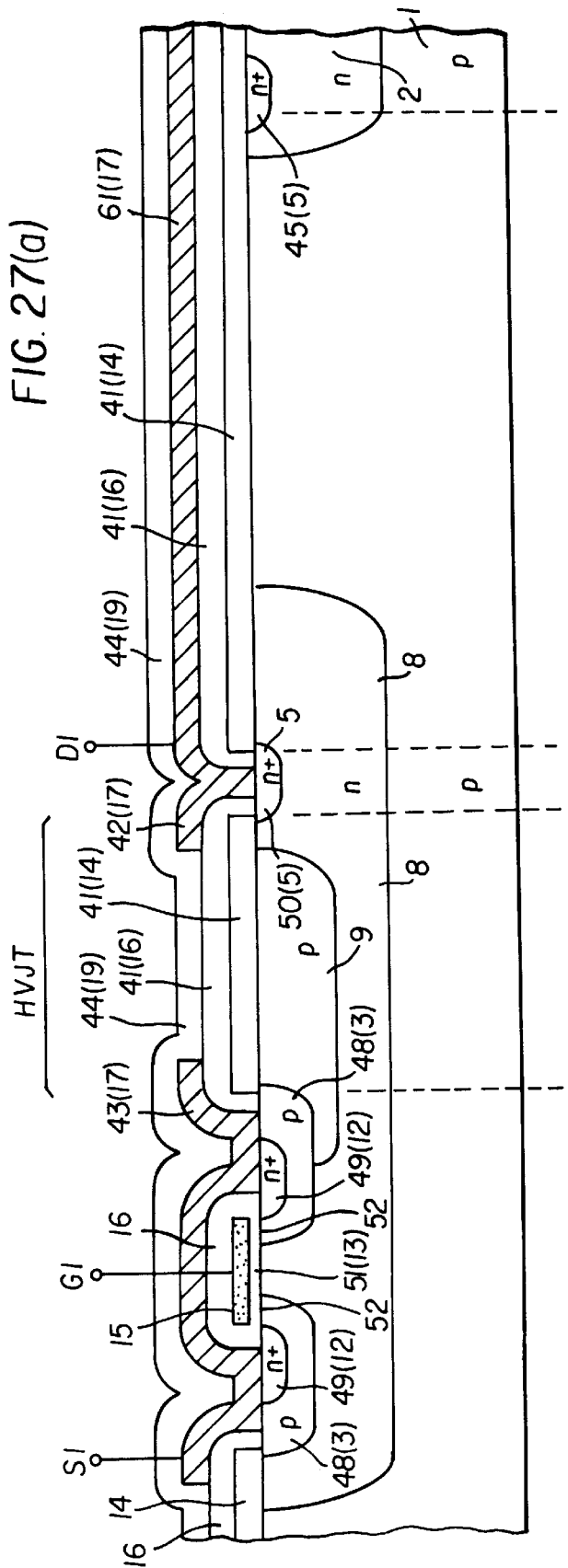
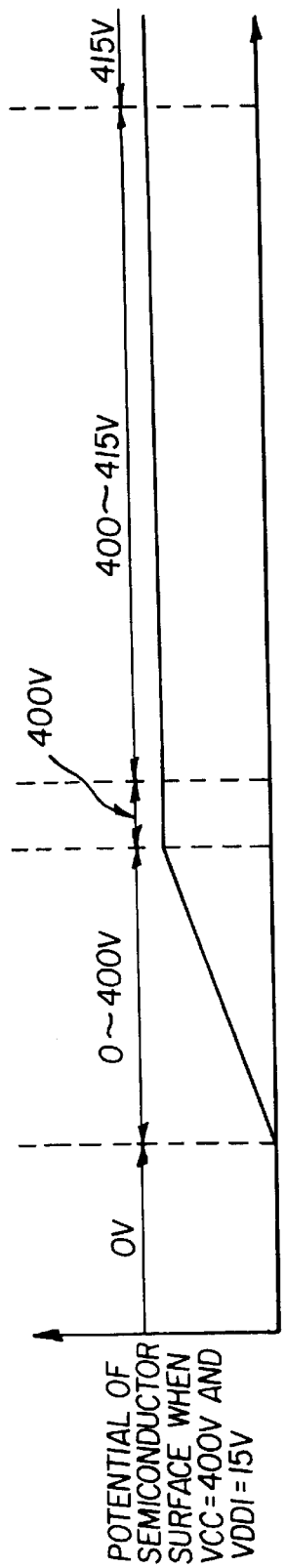
FIG. 27(a)
FIG. 27(b)

FIG. 30(a)
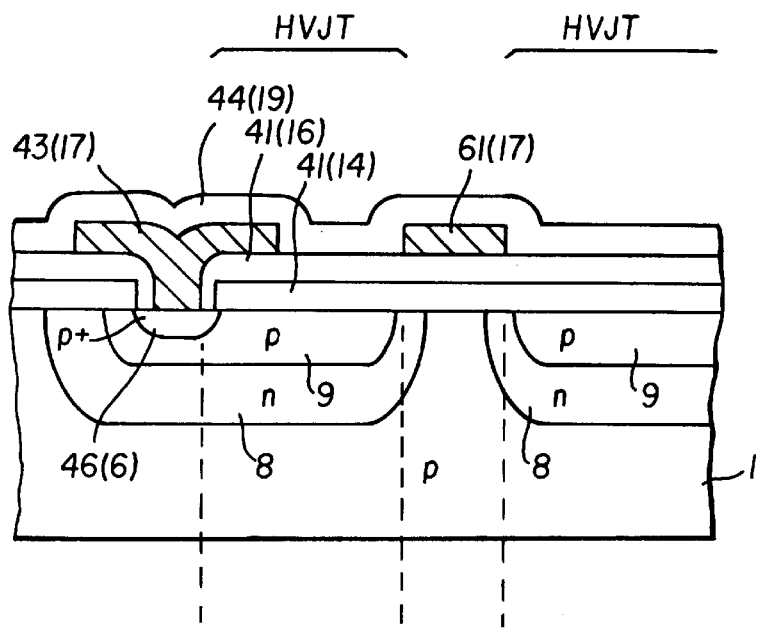
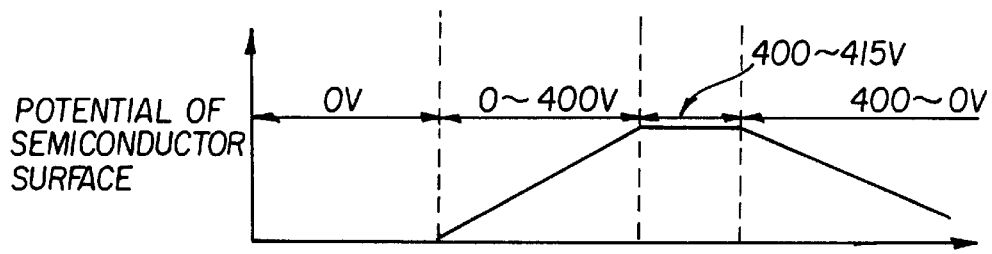
FIG. 30(b)

HIGH VOLTAGE INTEGRATED CIRCUIT, HIGH VOLTAGE JUNCTION TERMINATING STRUCTURE, AND HIGH VOLTAGE MIS TRANSISTOR

FIELD OF THE INVENTION

The present invention relates to a high voltage integrated circuit used for controlling and driving a power device, and in particular to a high voltage integrated circuit formed on a semiconductor substrate independent of the power device, or on the same semiconductor substrate on which the power device is provided.

BACKGROUND OF THE INVENTION

Numerals denoting footnotes to various references including patents and other documents are provided in the following description of the related prior art. The references cited in the footnotes are listed in the Bibliography section of the specification immediately following Background of the Invention section.

Power devices have been widely used in many applications including inverters or converters for controlling motors, inverters for illumination, various power sources, and switches for driving solenoids and relays[1-4]. The power devices were conventionally driven and controlled by electronic circuits constructed as a combination of individual semiconductor devices and electronic components[5,6]. These functions have been more recently performed by low-voltage integrated circuits of several dozens of volts class[7,8] or high voltage integrated circuits of several hundreds of volts[9,10], which utilize recent LSI (large scale integration) technology. Power integrated circuits in which drive and control circuits and power devices are integrated on the same semiconductor substrate are also used to reduce the size of conversion devices, such as inverters or converters, and achieve high operating reliability thereof[11,12].

FIG. 33 is a circuit diagram mainly showing a power-related portion of an inverter for controlling a motor. Power devices (Q1–Q6 as IGBTs—insulated gate bipolar transistor—and D1–D6 as diodes in this example) used for driving a three-phase motor form a bridge circuit, and are all stored in the same package to provide a power module[13]. The main power source $V_{CC}$ usually provides a high voltage of dc 100 to 400 volts. $V_{CCH}$ represents the high-potential side of the main power source $V_{CC}$, and $V_{CCL}$ represents the low-potential side of the main power source $V_{CC}$. To drive IGBTs Q1–Q3 connected to the $V_{CCH}$, the potential of gate electrodes of the IGBTs Q1–Q3 needs to be higher than the $V_{CCH}$. Accordingly, the drive circuit is provided with a photo coupler (PC) or a high voltage integrated circuit (HVIC). The input and output terminals (I/O) of the drive circuit are usually connected to a microcomputer adapted for controlling the inverter as a whole. FIG. 34 is a block diagram showing constituent units of the high voltage integrated circuit (HVIC) used in the circuit of FIG. 33. This circuit includes a control unit CU, gate drive units GDU and a level shift unit LSU. The control unit sends and receives signals to and from a microcomputer, through input and output terminals I/O, to generate control signals for turning on and off selected one(s) of the IGBTs. The gate drive units GDU 4–6 receive signals from the control circuit CU through input lines SIN 4–6 and generate signals to output lines OUT 4–6 for driving gates of the corresponding IGBTS. Each of the gate drive units GDU 4–6 also detects excessive current and heat of the IGBT with a current detecting terminal[14] OC 4–6 and a temperature terminal[15] OT 4–6, and generates abnormal signals through a corresponding output line SOUT 4–6. In this manner, the gate drive units GDU 4–6 drive corresponding IGBT Q4–Q6 connected to the low-potential side $V_{CCL}$ of the main power source $V_{CC}$ of FIG. 33. The gate drive units GDU1–GDU3 performs the same functions as the gate drive units GDU4–GDU6, to drive corresponding IGBT Q1 to Q3 that are connected to the high-potential side $V_{CCH}$ of the main power source $V_{CC}$. The level shift unit LSU functions as an interface between the $V_{CCL}$-level signals of the control circuit CU, and the signals (SIN 1–3, SOUT 1–3) of GDU 1–3 which fluctuate between the $V_{CCH}$ level and the $V_{CCL}$ level. Drive power sources (shown in FIG. 35) $V_{DD1}$–$V_{DD3}$ for the GDU 1–3 have respective high-potential sides $V_{DDH1}$–$V_{DDH3}$ and low-potential sides $V_{DDL1}$–$V_{DDL3}$. The GDU 4–6 are connected to a common drive power source $V_{DDC}$ (not shown in FIG. 35), which has a high-potential side $V_{DDHC}$ and a low-potential side $V_{DDLC}$. The common drive power source $V_{DDC}$ for the GDU 4–6 and CU is about 10 to 20V, and the low-potential side $V_{DDLC}$ of this common power source $V_{DDC}$ is connected to the low-potential side $V_{CCL}$ of the main power source $V_{CC}$ of FIG. 33.

FIG. 35 shows in more detail the connection between the GDU1 of FIG. 34 and the IGBT Q1. The other GDUs and IGBTs are not shown in this figure. The drive power source $V_{DD1}$ of the GDU1 is about 10 to 20 volts. The low-potential side $V_{DDL1}$ of this power source is connected to an emitter terminal of IGBT Q1, namely, a U phase of inverter output, and a collector terminal C of the IGBT Q1 is connected to the high-potential side $V_{CCH}$ of the main power source $V_{CC}$. In this arrangement, when the IGBT Q1 is turned on, the potential of $V_{DDL1}$ is made substantially equal to the potential of $V_{CCH}$. When the IGBT Q1 is turned off, the potential of $V_{DDL1}$ is made substantially equal to the potential of $V_{CCL}$. Accordingly, the withstand voltage between the GDU1 and other circuit units needs to be higher than the voltage of the main power source $V_{CC}$. This also applies to GDU2 and GDU3. Further, the level shift circuit LSU itself must have high withstand voltage. In FIG. 35, the IGBT Q1 includes a current detecting element[16] M, a temperature detecting element θ, and a temperature detecting terminal Temp. The gate drive unit GDU1 detects abnormal states of the IGBT Q1, through the current detecting terminal OC1 and the temperature detecting terminal OT1, and abnormal signals are generated through the output line SOUT 1. OUT 1 indicates a gate drive terminal.

FIG. 36 is a circuit diagram showing substantially the same circuit as that of FIG. 33, except the use of a product called "intelligent power module"[18]. In this case, the gate drive units GDU1–GDU6 consist of low voltage integrated circuits, individual electronic components and semiconductor devices, and are stored along with power devices (Q1–Q6, D1–D6) in a package containing the power devices. In this case, too, a photo coupler PC or high voltage integrated circuit HVIC is used as an exterior drive circuit.

FIG. 37 shows in detail the vicinity of IGBT Q1 and GDU1 of FIG. 36. SIN1 and SOUT1 are connected to the PC or HVIC provided outside of the power module.

To provide other structures, power IC technology for integrating the GDU1 and Q1 on one chip (on the same semiconductor substrate)[19,20], or power IC technology for integrating all the units of FIG. 36 in one chip[11,12] can be employed.

FIG. 38 is a plan view showing a chip of the high voltage integrated circuit HVIC shown in FIG. 34, to clarify the arrangement of circuit units constituting the circuit. The GDU1 is formed in an island electrically separated from the other circuit units by junction separation[21,22,10] or dielectric separation[23,11,12] to assure high withstand voltage, and the periphery of this GDU1 is surrounded by a high voltage junction terminating structure HVJT[11,21]. The HVJT is a structure of a terminating part of the junction to which high voltage is applied to insulate the unit therein from the other units. Within the level shift circuit LSU, there is provided a high voltage n-channel MOSFET (HVN) adapted for shifting a level of signal having the potential $V_{CCL}$ on the low-potential side of the main power source $V_{CC}$, to a level of signal (to be fed to the input line SIN1) having the potential $V_{DDL1}$ on the low-potential side of the drive power source $V_{DD1}$. This high voltage n-channel MOSFET is provided with a high voltage junction terminating structure[10,11] HVJT surrounding a drain electrode $D_N$ at the center of the MOSFET. Within the island of the GDU1, there is provided a high voltage p channel MOSFET (HVP) adapted for shifting $V_{DDL1}$ level of signals (received from the output line SOUT1), to $V_{CCL}$ level of signals. This high voltage p-channel MOSFET is also provided with a high voltage junction terminating structure HVJT surrounding a drain electrode $D_P$ at the center of the MOSFET. The input line SIN1 and output line SOUT1 of the GDU1 are installed to extend between GDU1 and LSU, over the high voltage junction terminating structure HVJT. Each of the GDUs is provided with an OUT terminal, OC terminal and OT terminal as shown in FIG. 35. GDU1–GDU3 are provided with respective $V_{DDH1}$–$V_{DDH3}$ terminals, and $V_{DDL}$–$V_{DDL3}$ terminals, and GDU4–GDU6 are provided with $V_{DDHC}$ terminal and $V_{DDLC}$ terminal. In FIG. 38, the arrangements of these elements of the GDU1 and GDU4 are shown in detail, and those of the other GDUs are not shown.

Problems encountered in the conventional high voltage integrated circuit and power IC include the difficulty in providing high withstand voltage exceeding 600V, and high manufacturing cost. The problems will be described in more detail.

(1) Problems relating to separation techniques

As described above, separation techniques for electrically separating a circuit unit (e.g., GDU 1, 2, 3 shown in FIG. 38) having a greatly different potential from other units include dielectric separation[11,12,13] junction separation[10,21,22] and self separation[20,24]. The structures for enabling dielectric separation and junction separation, however, are complicated, and require high manufacturing cost. The manufacturing cost is further increased with an increase in the withstand voltage required. Although the manufacturing cost can be reduced by employing the self separation, technology has not been developed for achieving high withstand voltage in the structure of CMOS (complimentary MOSFET). In the structure of NMOS (n-channel MOSFET) capable of providing high withstand voltage, it is extremely difficult to achieve sufficiently high accuracy of analog circuits (i.e., the current detecting circuit and temperature detecting circuit as described above).

(2) Problems relating to high voltage junction terminating structure HVJT

Various kinds of high voltage junction terminating structures have been disclosed that include those for vertical power devices[25,26], and those for lateral high voltage devices[27,29]. In the high voltage power IC in which the high voltage integrated circuit and power devices are integrated, however, high voltage junction terminating structures for many applications, such as those (surrounding GDU 1–3 in FIG. 38) formed between integrated circuit units, those (surrounding $D_N$ of HNN in FIG. 38) for high voltage lateral n-channel MOSFETs, those (surrounding $D_P$ of HVP in FIG. 39) for high voltage lateral p-channel MOSFETs, and those for vertical power devices, need to be formed on the same chip. With the conventional high voltage IC or power IC constructed for limited applications, many different kinds of high voltage junction terminating structures HVJT must be formed on the same chip, resulting in increased manufacturing cost.

(3) Problems relating to high voltage junction terminating structure on which wiring is provided In the high voltage IC in which signals travel between integrated circuit units (e.g., GDU1 and LSU of FIG. 38) having greatly different potentials, wiring needs to be provided on the high voltage junction terminating structure HVJT. In this case, however, the high voltage junction terminating structure HVJT may be influenced by the potential of the wiring provided thereon, resulting in reduced withstand voltage of the HVJT, as in (30). Although various structures have been proposed to solve this problem[10,11,12,31], these structures are complicated, and are only available at high manufacturing cost. Also, these proposed structures are not completely free from the influence of wiring, and is only able to prevent reduction of the withstand voltage to a limited extent. Thus, the known structures can provide the withstand voltage of up to about 600V, but cannot achieve higher withstand voltage.

It is therefore an object of the present invention to provide a high voltage integrated circuit at a reduced manufacturing cost, using inexpensive high voltage junction terminating structure having second and fourth regions for withstanding high voltage, which can be widely used as HVJT for vertical power devices, those for separating IC units from each other, and those for high voltage n-channel or p-channel lateral MOSFET, and which can maintain high withstand voltage even if wiring is provided thereon.

BIBLIOGRAPHY (1) U.S. Pat. No. 4,364,073 (relating to IGBT)
(2) U.S. Pat. No. 4,893,165 (relating to non-punch-through type IGBT)
(3) U.S. Pat. No. 5,008,725 (relating to power MOSFET)
(4) EP 0,071,916 corresponding to JP-A-58-39065 (relating to power MOSFET incorporating high-speed diode)
(5) U.S. Pat. No. 5,091,664 (relating to drive unit)
(6) U.S. Pat. No. 5,287,023 (relating to drive unit)
(7) U.S. Pat. No. 4,947,234 (relating to low voltage IC and power device)
(8) U.S. Pat. No. 4,937,646 (relating to low voltage IC and power device)
(9) A. Wegener and M. Amato "A HIGH VOLTAGE INTERFACE IC FOR HALF-BRIDGE CIRCUITS" Electrochemical Society Extended Abstracts, vol.89-1, pp.476–478 (1989)
(10) T. Terashima et al. "Structure of 600V IC and A New Voltage Sensing Device" IEEE Proceeding of the 5th International Symposium on Power Semiconductor Devices and ICs, pp.224–229 (1983)
(11) K. Endo et al. "A 500V 1A 1-chip Inverter IC with a New Electric Field Reduction Structure" IEEE Proceeding of the 6th International Symposium on Power Semiconductor Devices and ICs, pp.379–383 (1994)
(12) N. Sakurai et al. "A three-phase inverter IC for AC220V with a drastically small chip size and highly intelligent functions" IEEE Proceeding of the 5th International Symposium on Power Semiconductor Devices and ICs, pp.310–315 (1993)

(13) M. Mori et al. "A HIGH POWER IGBT MODULE FOR TRACTION MOTOR DRIVE" IEEE Proceeding of the 5th International Symposium on Power Semiconductor Devices and ICs, pp.287–289 (1993)

(14) U.S. Pat. No. 5,159,516 (relating to current detecting method)

(15) U.S. Pat. No. 5,070,322 (relating to temperature detecting method)

(16) U.S. Pat. No. 5,097,302 (relating to current detecting device)

(17) U.S. Pat. No. 5,304,837 (relating to temperature detecting device)

(18) K. Reinmuth et al. "Intelligent Power Modules for Driving Systems" IEEE Proceeding of the 6th International Symposium on Power Semiconductor Devices and ICs, pp.93–97 (1994)

(19) U.S. Pat. No. 4,677,325 (relating to IPS)

(20) U.S. Pat. No. 5,053,838 (relating to IPS)

(21) R. Zambrano et al. "A New Edge Structure for 2k Volt Power IC Operation" IEEE Proceeding of the 6th International Symposium on Power Semiconductor Devices and ICs, pp.373–378 (1994)

(22) M. F. Chang et al. "Lateral HVIC with 1200-V Bipolar and Field-Effect Devices" IEEE Transactions on Electron devices, vol. ED-33, No.12, pp.1992–2001 (1986)

(23) T. Ohoka et al. "A WAFER BONDED SOI STRUCTURE FOR INTELLIGENT POWER ICs" IEEE Proceeding of the 5th International Symposium on Power Semiconductor Devices and ICs, pp.119–123 (1993)

(24) J.P.MILLER "A VERY HIGH VOLTAGE TECHNOLOGY (up to 1200V) FOR VERTICAL SMART POWER ICs" Electrochemical Society Extended Abstracts, vol.89-1, pp.403–404 (1989)

(25) U.S. Pat. No. 4,399,449 (relating to HVJT for power device)

(26) U.S. Pat. No. 4,633,292 (relating to HVJT for power device)

(27) U.S. Pat. No. 4,811,075 (relating to HVJT for lateral MOSFET)

(28) U.S. Pat. No. 5,258,636 (relating to HVJT for lateral MOSFET)

(29) U.S. Pat. No. 5,089,871 (relating to HVJT for lateral MOSFET)

(30) P.K.T.MOK and C.A.T.SALAMA "Interconnect Induced Breakdown in HVIC's" Electrochemical Society Extended Abstracts, vol.89-1, pp.437–438 (1989)

(31) U.S. Pat. No. 5,043,781 (relating to power IC)

SUMMARY OF THE INVENTION

The above object may be accomplished according to a first aspect of the present invention, which provides a high voltage integrated circuit comprising: a first region of first conductivity type; a second region of second conductivity type formed in a selected area of a first major surface of the first region; a third region of first conductivity type formed in a selected area of a surface of the second region; first source region and first drain region of the first conductivity type formed in selected areas of the surface of the second region, apart from the third region; a first gate electrode formed on a surface of the second region between the first source region and the first drain region, through an insulating film; second source region and second drain region of second conductivity type formed in selected areas of a surface of the third region; and a second gate electrode formed on a surface of the third region between the second source region and the second drain region, through an insulating film.

In the high voltage integrated circuit constructed as described above, CMOS circuit surrounded by the second region is electrically isolated from the first region when the pn junction between the first and second regions is reverse biased. Accordingly, a plurality of CMOS circuits having different potentials may be integrated on the same chip at a reduced cost.

The second region is preferably formed such that an edge of a depletion layer appearing in the second region does not reach the third region when a first pn junction between the first region and the second region is reverse bias ed.

In this arrangement wherein the second region is wider than the depletion layer extending toward the third region, breakdown of a parasitic bipolar transistor (including the first region as a collector, the second region as a base, and the third region as an emitter) does not occur even if a high reverse bias voltage is applied to the first pn junction between the first and second regions.

To form the second region as described above, it is effective to control the net doping amount of the second region interposed between the first region and the third region to a range of $1 \times 10^{12}$ cm$^{-2}$ to $3 \times 10^{13}$ cm$^{-2}$. The net doping amount is obtained by subtracting a doping amount of first-conductivity-type impurities from a doping amount of second-conductivity-type impurities.

The desired net doping amount of the second region can be easily achieved by controlling amounts of impurities within the first, second and third regions, thus assuring high withstand voltage.

The high voltage integrated circuit as described above may further include a high voltage junction terminating structure formed in the shape of a loop to surround an outer periphery of the second region. In this case, reduction of the withstand voltage can be avoided due to the provision of a junction terminating portion (forming the high voltage junction terminating structure) in the semiconductor surface between the first and second regions. Thus, the withstand voltage of the second region isolated from the first region can be maintained at a high level.

In the high voltage IC including the high voltage junction terminating structure as described above, a fourth region of second conductivity type may be formed in the surface of the first region, apart from the second region, such that the fourth region is surrounded by the second region. In this case, the fourth region whose potential is greatly different from that of the first region but slightly different from that of the second region is formed adjacent to the second region. This fourth region may be used for a 15V power source for an analog circuit or a 5V power source for a logic circuit, for example. Thus, the circuit units with two different power source systems are provided such that the units are electrically isolated from the first region. A bipolar transistor having the fourth region as a collector may also be provided independent of the second region. Thus, the provision of the fourth region allows circuits to be designed with an increased degree of freedom, to provide an integrated circuit capable of high performance.

A first conductive film may be formed on a surface of the first region interposed between the second region and the fourth region, through an insulating film, such that the first conductive film partially overlaps the second and fourth regions. The first conductive film may be electrically connected to one of the second region and the fourth region. The first conductive film may also be connected to a low-potential one of the second region and the fourth region when the first conductivity type is p type, and connected to a high-potential one of the second and fourth regions when the first conductivity type is n type. The provision of this first conductive film can prevent reduction of the withstand voltage of the second and fourth regions with respect to the first region, at a portion where the second and fourth regions face each other, assuring high isolation withstand voltage.

When the first conductivity type is n type, the first region may be secured at a second major surface thereof to a metallic plate to which a collector electrode (in the case of IGBT) or a drain electrode (in the case of MOSFET) of an n-channel vertical power device is secured.

In the above arrangement, the potential of the rear surface of the high voltage IC (second main surface of the first region) can be maintained at the same level as the potential of the collector of the power device. Accordingly, the high voltage IC chip and the power device can be installed on the same metallic plate, requiring a reduced installation area. Further, heat generated by the power device through this metallic plate is efficiently transmitted to the high voltage IC chip, through the metallic plate. Therefore, the temperature of the high voltage IC chip changes according to changes of the temperature of the power device, and the temperature sensor provided in the high voltage IC ship is able to detect a temperature rise in the power device. Thus, the power device can be protected against excessive heat at a reduced cost, without requiring a conventional temperature detecting element provided on the power device.

When the first conductivity type is p type, the first region may be secured at a second major surface thereof to a metallic plate to which an emitter electrode (in the case of IGBT) or a source electrode (in the case of MOSFET) of an n-channel vertical power device is secured.

In the above arrangement, the potential of the rear surface of the high voltage IC can be maintained at the same level as the potential of the emitter of the power device. Accordingly, the high voltage IC chip and the power device can be installed on the same metallic plate, requiring a reduced installation area. Further, heat generated by the power device through this metallic plate is directly transmitted to the high voltage IC chip, and therefore the temperature of the high voltage IC chip changes according to changes of the temperature of the power device, as described above. Thus, the power device can be protected against excessive heat at a reduced cost, without requiring a conventional temperature detecting element provided on the power device.

The high voltage integrated circuit may be integrated with an n-channel vertical power device on the same semiconductor substrate, and the first region may be formed in common with an n-type layer of low impurity concentration (e.g., n-type drift layer or low concentration n-type drain layer) of the n-channel vertical power device. In this case, the high voltage IC and the power device can be integrated on the same chip (the same semiconductor substrate), resulting in a reduced installation area. Further, the temperature of the power device portion of the chip can be directly detected with high accuracy by the IC portion of the same chip.

The above-described high voltage IC may further include a high voltage junction terminating structure surrounding the second region and a p base region of the n-channel vertical power device. The second region may be surrounded by the p base region of the n-channel vertical power device. In this arrangement, the withstand voltage is not lowered at a boundary region between the power device and the IC, and can be thus maintained at a sufficiently high level.

The second region may be formed by implanting ions of impurity material into the selected area of the first major surface of the first region, and thermally diffusing the impurity material. The third region may be formed by implanting ions of impurity material into the selected area of the surface of the second region, and thermally diffusing the impurity material. Thus, the high voltage IC may be manufactured at a reduced cost.

The high voltage integrated circuit may further include at least one fifth region of second conductivity type in a selected area of the surface of the second region adjacent to the third region, the fifth region(s) having a higher impurity concentration than the second region. The fifth region of second conductivity type may also be formed in a selected area of the surface of the second region adjacent to the first region, or may be formed so as to substantially surround the third region. The fifth region may also be formed in a most part of the surface of the second region, excluding an active region thereof in which is formed a MOSFET comprising the first source region and first drain region formed in the surface of the second region, and the first gate electrode formed on the surface of the second region between the first source region and the first drain region. The provision of the fifth region(s) makes it possible to reduce the base resistance of a parasitic bipolar transistor having the first region as a collector, the second region as a base and the third region as an emitter, thereby preventing breakdown or latch up of the parasitic bipolar transistor due to its wrong operation.

The high voltage integrated circuit may further include a sixth region of first conductivity type formed in a surface of the third region adjacent to the second region, the sixth region having a higher impurity concentration than the third region. The provision of the sixth region makes it possible to reduce the base resistance of a parasitic bipolar transistor having the second region as a collector, the third region as a base, and a source or drain of a second-conductivity-type-channel MIS transistor (Metal-Insulator-Semiconductor transistor) as an emitter, thereby preventing breakdown or latch up of the parasitic bipolar transistor due to its wrong operation.

The above object may also be accomplished according to a second aspect of the present invention, which provides a high voltage junction terminating structure comprising: a first region; an eighth region of second conductivity type formed in a selected area of a first major surface of the first region, the eighth region and the first region forming a second pn junction therebetween; and a ninth region of first conductivity type formed in a selected area of a surface of the eighth region, the eighth region and the ninth region forming a third pn junction therebetween; wherein the eighth region is formed such that a second depletion layer appearing on both sides of the second pn junction is combined with a third depletion layer appearing on both sides of the third pn junction, and the ninth region is formed such that the third depletion layer reaches a surface of the ninth region, when the second and third pn junctions are both reverse biased.

When the second and third pn junction s are both reverse biased, depletion layers completely fill the eighth and ninth regions of the high voltage junction terminating structure, such that an integral depletion layer extending from within the first region up to the surface of the eighth region through the ninth region is formed in the horizontal direction over the entire high voltage junction terminating structure. This arrangement assures high withstand voltage in the horizontal direction, and also in the vertical direction since the depletion layer extends in the vertical direction (perpendicular to the first major surface) into the first region having a low impurity concentration. If the first region has a sufficiently low impurity concentration, therefore, the withstand voltage can be increased by increasing the horizontal distance of the high voltage junction terminating structure.

To provide the high voltage junction terminating structure as described above, a portion of the eighth region located under the ninth region between the first region and the ninth region preferably has a net doping amount of $1\times10^{11}$ cm$^{-2}$ to $4\times10^{12}$ cm$^{-2}$, and the ninth region preferably has a net doping amount of $1\times10^{11}$ cm$^{-2}$ to $2\times10^{12}$ cm$^{-2}$.

The high voltage junction terminating structure may further include an insulating film on the ninth region, a second conductive film partially overlapping the insulating film and electrically connected to the eighth region, a third conductive film partially overlapping the insulating film and electrically connected to the ninth region, a high resistance film contacting the second and third conductive films and covering the insulating film between the second and third conductive films. In this arrangement, the current flowing through the high resistance film between the second and third conductive films gives rise to smooth potential distribution in the horizontal direction of the resistance film. The high resistance film applies the smooth potential distribution therein into a semiconductor region (ninth, eighth and first regions) below the insulating film, through the capacity of the insulating film, so that the potential distribution in the depletion layer of the semiconductor region is smoothly stabilized in the horizontal direction. This is effective to achieve a high withstand voltage with a reduced horizontal distance of the high voltage junction terminating structure.

In the above high voltage junction terminating structure, the eighth region may be formed by implanting ions of impurity material into the selected area of the first major surface of the first region, and thermally diffusing the impurity material. The ninth region may be formed by implanting ions of impurity material into the selected area of the surface of the eighth region, and thermally diffusing the impurity material. Thus, the high voltage junction terminating structure may be easily incorporated into the high voltage IC at a reduced cost.

According to a third aspect of the invention, there is provided a second-conductivity-type-channel high voltage MIS transistor comprising: the high voltage junction terminating structure as described above; a first drain electrode disposed on one side of the high voltage junction terminating structure, such that the first drain electrode is electrically connected to the eighth region; a base region of first conductivity type formed on the other side of the high voltage junction terminating structure, such that the base region is in contact with the ninth region; a source region of second conductivity type formed in a selected area of a surface of the base region; a channel region of second conductivity type formed in the surface of the base region interposed the eighth region and the source region of second conductivity type; a first gate insulating film formed on the channel region of second conductivity type; a third gate electrode formed on the first gate insulating film; and a first source electrode electrically connected to at least the source region of second conductivity type. This high voltage MIS transistor in which the eighth region having high withstand voltage is used as a drain may be incorporated into the high voltage IC.

According to a fourth aspect of the invention, there is provided a first-conductivity-type high voltage MIS transistor comprising: the high voltage junction terminating structure as described above; a source region of first conductivity type formed in a selected area of a surface of the eighth region, on one side of the high voltage junction terminating structure; a channel region of first conductivity type formed in a surface of the eighth region interposed between the ninth region and the source region of first conductivity type; a second gate insulating film formed on at least the channel region of first conductivity type; a fourth electrode formed on the second gate insulating film; a second source electrode electrically connected to at least the source region of first conductivity type; and a second drain electrode disposed on the other side of the high voltage junction terminating structure, such that the second drain electrode is electrically connected to the ninth region. Thus, the high voltage MIS transistor in which the ninth region having high withstand voltage is used as a drain may be incorporated into the high voltage IC. The conductivity type of the channel region of this high voltage MIS transistor is reversed with respect to that of the above-described second-conductivity-type high voltage MIS transistor according to the third aspect of the invention, and these transistors include basically the same high voltage junction terminating structure to assure high withstand voltage. Therefore, the high voltage MIS transistors according to the third and fourth aspects of the invention can be integrated on the same chip, at a reduced cost, and thus used in a complementary fashion.

According to a fifth aspect of the present invention, there is provided a high voltage integrated circuit comprising: the high voltage junction terminating structure as described above; a second region of second conductivity type surrounded by the high voltage junction terminating structure and electrically connected to the eighth region; a third region of first conductivity type formed in a selected area of a surface of the second region; a first-conductivity-type-channel MIS transistor formed in the surface of the second region; and a second-conductivity-type-channel MIS transistor formed in a surface of the third region. In the high voltage IC having the high voltage junction terminating structure constructed as described above, a circuit unit (corresponding to GDU1 of FIG. 2 or FIG. 6) may be easily isolated or separated from the other circuit units, assuring high withstand voltage. Further, this high voltage junction terminating structure has the basically the same structure as those used in the high voltage MIS transistors according to the third and fourth aspect of the invention, and can be thus incorporated into the high voltage IC at a reduced cost.

The second region and the eighth region may be continuously formed as a single region in the same process step. In this manner, the above-described high voltage IC can be manufactured at a reduced cost.

The second-conductivity-type MIS transistor may consist of the high voltage MIS transistor constructed according to the third aspect of the invention. In addition, the first-conductivity-type MIS transistor may consist of the high voltage MIS transistor constructed according to the fourth aspect of the invention. In these cases, the high voltage IC as shown in FIG. 2 or 6 can be produced at a reduced cost.

The eighth region of the above-described high voltage junction terminating structure may be formed by implanting ions of impurity material into the selected area of the first major surface of the first region, and thermally diffusing the impurity material. The ninth region is formed by implanting ions of impurity material into the selected area of the surface of the eighth region, and thermally diffusing the impurity material. In these manners, the high voltage junction terminating structure can be produced at a reduced cost.

In the high voltage IC according to the fifth aspect of the invention, the second region may be formed such that when a first pn junction between the first region and the second region is reverse biased, an edge of a first depletion layer appearing in the second region is located between a fourth pn junction between the second region and the third region, and the first pn junction. In this case, even if a high reverse bias voltage is applied to the first pn junction between the first and second regions, a parasitic bipolar transistor including the first region as a collector, the second region as a base, and the third region as an emitter does not undergo breakdown, and the withstand voltage of the second region isolated from the first region can be thus maintained at a high level.

To form the second region as described above, a portion of the second region located under the third region between the first region and the third region preferably has a net doping amount of $1 \times 10^{12}$ cm$^{-2}$ to $3 \times 10^{13}$ cm$^{-2}$. Thus, the high withstand voltage can be easily obtained by controlling the amounts of impurities of the first, second and third regions to achieve the above-indicated net doping amount of the second region.

The second region may be formed by implanting ions of impurity material into the selected area of the first major surface of the first region, and the third region may be formed by implanting ions of impurity material into the selected area of the surface of the second region, and thermally diffusing the impurity material. In these manners, the high voltage integrated circuit can be manufactured at a reduced cost.

According to a sixth aspect of the present invention, there is provided a high voltage integrated circuit comprising: a first region of first conductivity type; a second region of second conductivity type formed in a selected area of a first major surface of the first region; a third region of first conductivity type formed in a selected area of a surface of the second region; a first-conductivity-type-channel MIS transistor comprising first source region and first drain region of first conductivity type formed in selected areas of the surface of the second region, apart from the third region, and a first gate electrode formed through an insulating film on a surface of the second region interposed between the first source region and the first drain region; a second-conductivity-type-channel MIS transistor comprising second source region and second drain region of second conductivity type formed in selected areas of the surface of the third region, and a second gate electrode formed through an insulating film on a surface of the third region interposed between the second source region and the second drain region; a first high voltage junction terminating structure surrounding the second region; a second high voltage junction terminating structure formed in the shape of a loop and having the same structure as the first high voltage junction terminating structure; and a second-conductivity-type-channel high voltage MIS transistor including a first drain electrode formed inside the loop of the second high voltage junction terminating structure, and third gate electrode and first source electrode formed outside the loop of the second high voltage junction terminating structure.

In the high voltage IC constructed as described above, the high voltage junction terminating structure for the circuit unit (e.g., GDU1 of FIG. 2 or FIG. 6) isolated with high withstand voltage from the other circuit units can be provided on the same chip in the same process step, as the high voltage junction terminating structure for the second-conductivity-type-channel high voltage MIS transistor (e.g., HVN of FIG. 6). This leads to a reduced cost for manufacturing the high voltage IC.

The second high voltage junction terminating structure is preferably connected with the first high voltage junction terminating structure.

In the high voltage IC according to the above aspect of the invention, a first output line may extend from the first drain electrode through the second high voltage junction terminating structure, onto the second region surrounded by the first high voltage junction terminating structure.

In the above arrangement, the first output line for transmitting (shifting levels of) signals between circuit units having greatly different potentials extends from the first drain electrode of the second-conductivity-type MIS transistor, onto the second region having a relatively small potential difference from the first drain electrode, such that the first output line passes only a portion of the high voltage junction terminating structure having a small potential difference. Accordingly, the high voltage IC is free from the conventional problem of reduction of the withstand voltage caused by the wiring (output line) extending over a portion of the high voltage junction terminating structure having a large potential difference. This is a significant effect of the present invention, which can be realized at a low cost without requiring a complicated structure. Since the withstand voltage is not lowered at all, the high voltage IC can even provide several thousands of volts of withstand voltage. This structure will be described in detail referring to FIGS. 19, 20 and 22.

According to a seventh aspect of the present invention, there is provided a high voltage integrated circuit comprising: a first region of first conductivity type; a second region of second conductivity type formed in a selected area of a first major surface of the first region; a third region of first conductivity type formed in a selected area of a surface of the second region; a first-conductivity-type-channel MIS transistor comprising first source region and first drain region of first conductivity type formed in selected areas of the surface of the second region, apart from the third region, and a first gate electrode formed through an insulating film on a surface of the second region interposed between the first source region and the first drain region; a second-conductivity-type-channel MIS transistor comprising second source region and second drain region of second conductivity type formed in selected areas of the surface of the third region, and a second gate electrode formed through an insulating film on a surface of the third region interposed between the second source region and the second drain region; a first high voltage junction terminating structure surrounding the second region; a third high voltage junction terminating structure formed in the shape of a loop and having basically the same structure as the first high voltage junction structure; and a first-conductivity-type-channel high voltage MIS transistor including a second drain electrode formed inside the loop of the third high voltage junction terminating structure, and fourth gate electrode and second source electrode formed outside the loop of the third high voltage junction terminating structure. As explained above with respect to the sixth aspect of the invention, the high voltage junction terminating structure for the circuit unit (e.g., GDU1 of FIG. 2 or FIG. 6) isolated with high withstand voltage from the other circuit units can be provided on the same chip in the same process step, as the high voltage junction terminating structure for the first-conductivity-type-channel high voltage MIS transistor (e.g., HVP of FIG. 6). This leads to a reduced cost for manufacturing the high voltage IC.

The third high voltage junction terminating structure is preferably connected with the first high voltage junction terminating structure.

In the high voltage IC according to the seventh aspect of the invention, a second output line may extend from the second drain electrode through the third high voltage junction terminating structure, to the outside of the first high voltage terminating structure.

In the above arrangement, the second output line for transmitting (shifting levels of) signals between circuit units having greatly different potentials extends from the second drain electrode of the first-conductivity-type MIS transistor, onto the first region (or other region formed on the first region) having a relatively small potential difference from the second drain electrode, such that the second output line passes only a portion of the high voltage junction terminating structure having a small potential difference. Accordingly, the high voltage IC is free from the conventional problem of reduction of the withstand voltage caused by the wiring (output line) extending over a portion of the high voltage junction terminating structure having a large potential difference. This is a significant effect of the present invention, which can be realized at a low cost without requiring a complicated structure. Since the withstand voltage is not lowered at all, the high voltage IC can even provide several thousands of volt s of withstand voltage. This structure will be described in detail referring to FIGS. 19, 20 and 22.

In one preferred form of the sixth aspect of the invention, the first high voltage junction terminating structure consists of a high voltage junction terminating structure comprising: a first region; an eighth region of second conductivity type formed in a selected area of a first major surface of the first region, the eighth region and the first region forming a second pn junction therebetween; and a ninth region of first conductivity type formed in a selected area of a surface of the eighth region, the eighth region and the ninth region forming a third pn junction therebetween, where in the eighth region is formed such that a second depletion layer appearing on both sides of the second pn junction is combined with a third depletion layer appearing on both sides of the third pn junction, and the ninth region is formed such that the third depletion layer reaches a surf ace of the ninth region, when the second and third pn junctions are both reverse biased, and wherein a portion of the eighth region located under the ninth region between the first region and the ninth region has a net doping amount of $1 \times 10^{11}$ cm$^{-2}$ to $4 \times 10^{2}$ cm$^{-2}$, and the ninth region has a net doping amount of $1 \times 10^{11}$ cm$^{-2}$ to $2 \times 10^{12}$ cm$^{-2}$. Further, the second-conductivity-type-channel high voltage MIS transistor includes: the high voltage junction terminating structure as described above; a first drain electrode disposed on one side of the high voltage junction terminating structure, such that the first drain electrode is electrically connected to the eighth region; a base region of first conductivity type formed on the other side of the high voltage junction terminating structure, such that the base region is in contact with the ninth region; a source region of second conductivity type formed in a selected area of a surface of the base region; a channel region of second conductivity type formed in the surface of the base region interposed the eighth region and the source region of second conductivity type; a first gate insulating film formed on the channel region of second conductivity type; a third gate electrode formed on the first gate insulating film; and a first source electrode electrically connected to at least the source region of second conductivity type.

In one form of the seventh aspect of the invention, the first high voltage junction terminating structure consist of the high voltage junction terminating structure as described just above, and the first-conductivity-type-channel high voltage MIS transistor includes: the high voltage junction terminating structure; a source region of first conductivity type formed in a selected area of a surface of the eighth region, on one side of the high voltage junction terminating structure; a channel region of first conductivity type formed in a surface of the eighth region interposed between the ninth region and the source region of first conductivity type; a second gate insulating film formed on at least the channel region of first conductivity type; a fourth electrode formed on the second gate insulating film; a second source electrode electrically connected to at least the source region of first conductivity type; and a second drain electrode disposed on the other side of the high voltage junction terminating structure, such that the second drain electrode is electrically connected to the ninth region.

The second region and the eighth region of the high voltage IC according to the sixth and seventh aspects of the invention may be formed in the same process step. This leads to reduction of the cost for manufacturing the high voltage ICs.

According to a ninth aspect of the present invention, there is provided a high voltage integrated circuit comprising: a first region of first conductivity type; a second region of second conductivity type formed in a selected area of a first major surface of the first region; a third region of first conductivity type formed in a selected area of a surface of the second region; a first-conductivity-type-channel MIS transistor comprising first source region and first drain region of first conductivity type formed in selected areas of the surface of the second region, apart from the third region, and a first gate electrode formed through an insulating film on a surface of the second region interposed between the first source region and the first drain region; a second-conductivity-type-channel MIS transistor comprising second source region and second drain region of second conductivity type formed in selected areas of the surface of the third region, and a second gate electrode formed through an insulating film on a surface of the third region interposed between the second source region and the second drain region; a first high voltage junction terminating structure surrounding the second region; a second high voltage junction terminating structure formed in the shape of a loop with a discontinuity, and having the same structure as the first high voltage junction structure; a second-conductivity-type-channel high voltage MIS transistor including a first drain electrode formed inside the loop of the second high voltage junction terminating structure, and a third gate electrode and a first source electrode formed outside the loop of the second high voltage junction terminating structure; and a first output line extending from the first drain electrode onto the second region, through the discontinuity of the second high voltage junction terminating structure.

According to a tenth aspect of the present invention, there is provided a high voltage integrated circuit comprising: a first region of first conductivity type; a second region of second conductivity type formed in a selected area of a first major surface of the first region; a third region of first conductivity type formed in a selected area of a surface of the second region; a first-conductivity-type-channel MIS transistor comprising first source region and first drain region of first conductivity type formed in selected areas of the surface of the second region, apart from the third region, and a first gate electrode formed through an insulating film on a surface of the second region interposed between the first source region and the first drain region; a second-conductivity-type-channel MIS transistor comprising second source region and second drain region of second conductivity type formed in selected areas of the surface of the third region, and a second gate electrode formed through an insulating film on a surface of the third region interposed between the second source region and the second drain region; a first high voltage junction terminating structure surrounding the second region; a third high voltage junction terminating structure formed in the shape of a loop with a discontinuity, and having the same structure as the first high voltage junction structure; a first-conductivity-type-channel high voltage MIS transistor including a second drain electrode formed inside the loop of the third high voltage junction terminating structure, and fourth gate electrode and second source electrode formed outside the loop of the third high voltage junction terminating structure; and a second output line extending from the second drain electrode to the outside of the first high voltage junction terminating structure, through the discontinuity of the third high voltage junction terminating structure.

In either of the ninth and tenth aspects of the invention, each of the first and third high voltage junction terminating structures may include: a first region; an eighth region of second conductivity type formed in a selected area of a first major surface of the first region, the eighth region and the first region forming a second pn junction therebetween; and a ninth region of first conductivity type formed in a selected area of a surface of the eighth region, the eighth region and the ninth region forming a third pn junction therebetween, wherein the eighth region is formed such that a second depletion layer appearing on both sides of the second pn junction is combined with a third depletion layer appearing on both sides of the third pn junction, and the ninth region is formed such that the third depletion layer reaches a surface of the ninth region, when the second and third pn junctions are both reverse biased, and wherein a portion of the eighth region located under the ninth region between the first region and the ninth region has a net doping amount of $1 \times 10^{11}$ cm$^{-2}$ to $4 \times 10^{12}$ cm$^{-2}$, and the ninth region has a net doping amount of $1 \times 10^{11}$ cm$^{-2}$ to $2 \times 10^{12}$ cm$^{-2}$. In this case, the high voltage integrated circuit can be manufactured at a further reduced cost.

BRIEF DESCRIPTION OF THE DRAWINGS

The invention will be described in greater detail with reference to certain preferred embodiments thereof and the accompanying drawings, wherein:

FIGS. 3(a)–3(c) are views showing the third embodiment of the present invention, wherein FIG. 3(a) is a plan view showing a unit of gate drive circuit formed in one chip, FIG. 3(b) being a cross sectional view thereof, and FIG. 3(c) being a cross sectional view of the gate drive unit and power device formed on a heat sink;

FIGS. 4(a)–4(c) are views showing the fourth embodiment of the present invention, wherein FIG. 4(a) is a plan view of GDUIC1 as a high voltage IC, in which only GDU1 is integrated on one chip, FIG. 4(b) being a cross sectional view thereof, and FIG. 4(c) being a cross sectional view showing GDUIC1 secured onto an emitter (or source) electrode of a power device Q1;

FIGS. 8(a)–(c) are views showing the eighth embodiment of the present invention in which the high voltage junction terminating structure is used for a diode, wherein FIG. 8(a) is a cross sectional view thereof, FIG. 8(b) being a plan view thereof, and FIG. 8(c) being another plan view thereof;

FIG. 15(a) is a cross sectional view of the fourteenth embodiment of the present invention, taken along line A—A of FIG. 13, and FIG. 15(b) is a graph representing the potential distribution in the structure of FIG. 15(a);

FIG. 17(a) is a cross sectional view of the fourteenth embodiment of the invention, taken along line C—C of FIG. 14, and FIG. 17(b) is a graph representing the potential distribution in the structure of FIG. 17(a);

FIG. 22(a) is a cross sectional view of the sixteenth embodiment of the invention, taken along line A—A of FIG. 21, and FIG. 22(b) is a graph representing the potential distribution in the structure of FIG. 22(a);

FIG. 24(a) is a cross sectional view of the sixteenth embodiment of the invention, taken along line C—C of FIG. 21, and FIG. 24(b) is a graph representing the potential distribution in the structure of FIG. 24(b);

FIG. 27(a) is a cross sectional view of the seventeenth embodiment of the invention, taken along line A—A of FIG.

21, and FIG. 27(b) is a graph representing the potential distribution in the structure of FIG. 27(a);

FIG. 30(a) is a cross sectional view of the seventeenth embodiment of the invention, taken along line X—X of FIG. 21, and FIG. 30(b) is a graph representing the potential distribution in the structure of FIG. 30(b);

DETAILED DESCRIPTION OF THE PREFERRED EMBODIMENTS

Figure 1:
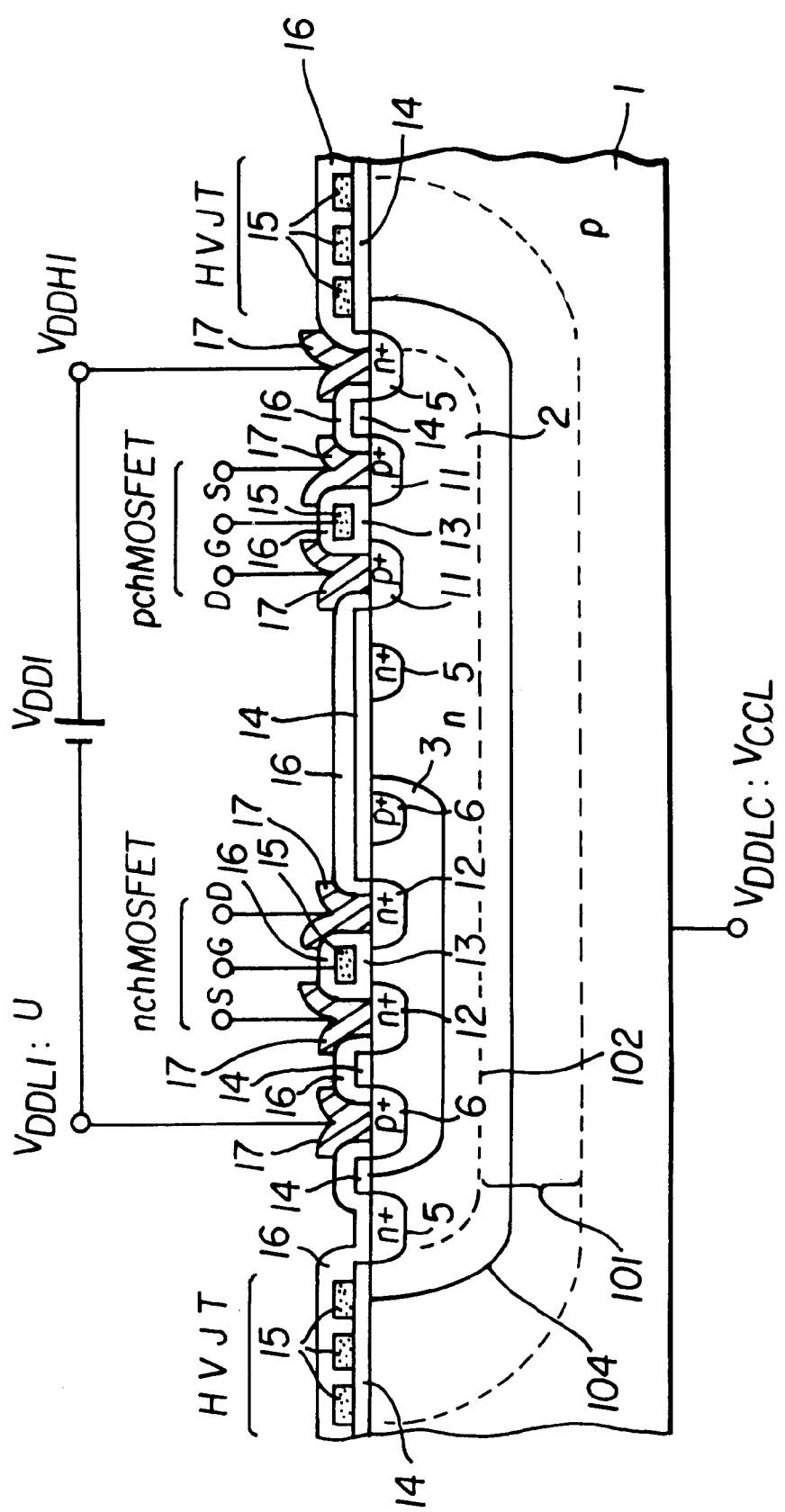
FIG. 1 a cross sectional view showing a principal part of the first embodiment of the present invention.

FIG. 1 is a cross sectional view showing a principal part of the first embodiment of the present invention. The present invention applies to GDU 1–3 of FIG. 38 that are surrounded by respective high voltage junction terminating structures HVJT. In the description of the following embodiments except a few, the first conductivity type means p type, and the second conductivity type means n type.

A high voltage integrated circuit (HVIC) according to the first embodiment includes: a first region 1 consisting of a p-type semiconductor substrate doped with boron; an n-type second region 2 formed by implanting phosphorous ions into a selected area of a surface layer of the first region 1, and thermally diffusing the ions at a high temperature; a p-type third region 3 formed by implanting boron ions into a selected area of a surface layer of the second region 2, and thermally diffusing the ions at a high temperature; n-type fifth regions 5 formed by implanting phosphorous ions into selected areas of a surface layer of the second region 2; p-type sixth regions 6 formed by implanting boron ions into selected areas of a surface layer of the third region 3; p-channel MOSFET (pch MOSFET) including $p^+$ regions 11 having a high impurity concentration and formed in selected areas of the surface layer of the second region 2, to provide a first source region and a first drain region, and a gate electrode in the form of a polycrystalline silicon film 15 that is formed on a portion of the second region 2 interposed between the $p^+$ type regions 11, through a gate insulating film 13; n-channel MOSFET (nch MOSFET) including $n^+$ regions 12 formed in selected areas of the surface layer of the third region 3, to provide a second source region and a second drain region, and a gate electrode in the form of a polycrystalline silicone film 15 formed on a portion of the second region 2 interposed between the $n^+$ regions 12, through a gate insulating film 13; and a high voltage terminating structure HVJT that surrounds the first region 1 so as to prevent breakdown due to concentration of an electric field at around the IC surface when a high voltage is applied to reverse bias a first pn junction between the first and second regions 1, 2.

The $p^+$ regions 11 are doped with a high concentration of boron, and the $n^+$ region 12 are doped with a high concentration of phosphorous. The gate insulating film 13 is formed from a silicone oxide film having a thickness of about 200 to 500 Å. Field insulating film 14 in the form of a silicon oxide film having a thickness of about 5000 to 10000 Å is formed on part of the first, second and fifth regions 1, 2, 5. On selected areas of this insulating film 14, there are formed conductive films in the form of n-type polycrystalline silicone films 15 doped with phosphorous and having a thickness of about 3000 to 6000 Å. The polycrystalline silicon films are also formed in areas where the third and second regions 3, 2 face each other, as shown in FIG. 1. Interlayer insulating films 16 are BPSG films having a thickness of 5000 to 10000 Å and formed by a CVD method under ordinary pressure, for example. First metallic films 17 are Al-1% Si films having a thickness of 5000 to 10000 Å and used as wires (leads) or electrodes on the first major surface of the IC. The first region 1 has an impurity concentration of about $10^{13}$ to $10^{15}$ cm$^{-3}$, preferably, not higher than $1.5\times 10^{14}$ cm$^{-3}$ in the case of the 600V-class (withstand voltage) IC, and not higher than $8\times 10^{13}$ cm$^{-3}$ in the case of the 1200V-class (withstand voltage) IC. Thus, the appropriate impurity concentration varies depending on the required withstand voltage. The impurity concentration of the first region 1 and the doping amount of impurities in the second region 2 are determined so that, when a first pn junction 104 between the first and second regions 1, 2 is reverse biased with a high voltage and a depletion layer 101 spreads out on both sides of the pn junction 104, an edge of the depletion layer 101 on the side of the second region 102 does not reach the third region 3, but remains in the second region 2. To this end, it is effective to control the net doping amount of a portion of the second region 2 located under the third region 3 between the third and first regions 3, to within a range of $1\times 10^{12}$ cm$^{-2}$ to $3\times 10^{13}$ cm$^{-2}$. This net doping amount is obtained by subtracting a doping amount of p-type impurities from that of n type impurities. As a typical example, the second region 2 is formed by implanting phosphorous ions into its selected areas in an amount of $5\times 10^{12}$ to $1\times 10^{13}$ cm$^{-2}$, and effecting thermal diffusion at 1150° C. for about three to ten hours, such that the diffusion depth is controlled to about 3 to 8 μm. The third region 3 is formed by implanting boron ions into its selected areas in an amount of $1\times 10^{13}$ to $5\times 10^{13}$ cm$^{-2}$, and effecting thermal diffusion at 1100° C. for about two to ten hours, such that the diffusion depth is controlled to about 1 to 4 μm. The net doping amounts of the fifth and sixth regions 5, 6 are in the range of about $1\times 10^{14}$ to $1\times 10^{15}$ cm$^{-2}$, and the net doping amounts of the $p^+$ and $n^+$ regions 11, 12 are in the range of about $1\times 10^{15}$ to $1\times 10^{16}$ cm$^{-2}$. The high voltage junction structure HVJT may be selected from various structures as disclosed in the references cited in the description of the related art, and others.

The n-type fifth region 5 having a relatively high impurity concentration are provided in the second region 2 so as to reduce the base resistance of a parasitic bipolar transistor having the second region 2 as a base and the third portion 3 as an emitter, and thus avoid wrong operation of the transistor. The wrong operation can be more effectively prevented by forming the fifth region 5 in a surface layer of the second region 2 facing the third region 3, or in a surface layer of the second region 2 facing the first region 1, or forming the fifth region 5 so as to surround most of the third region 3, or covering with the fifth region 5 a substantial portion of a field region of the surface of the second region 2 on which MOSFET or other device is not formed. The p-type sixth regions 6 having a relatively high impurity concentration are provided in the third region 3 so as to reduce the base resistance of a parasitic bipolar transistor having the second region 2 as a collector, the third region 3 as a base, and the n$^+$ region 12 as an emitter, and thus avoid wrong operation of the transistor. This effect can be enhanced due to similar arrangements as employed in forming the fifth region 5.

Figure 33:
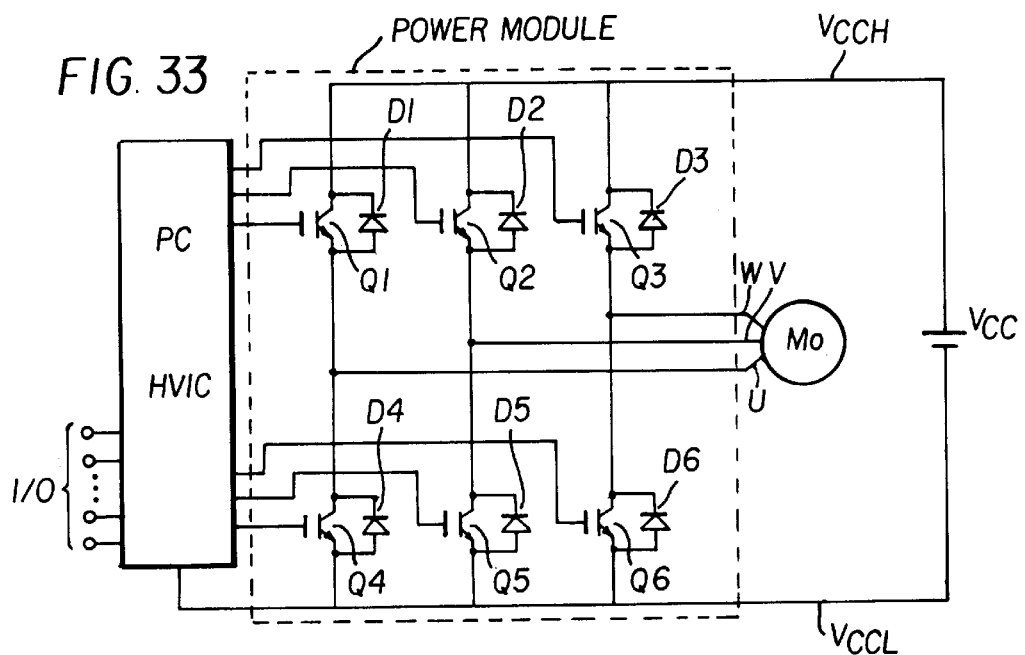
FIG. 33 is a circuit diagram mainly showing a power-related portion of an inverter for controlling a motor.
Figure 34:
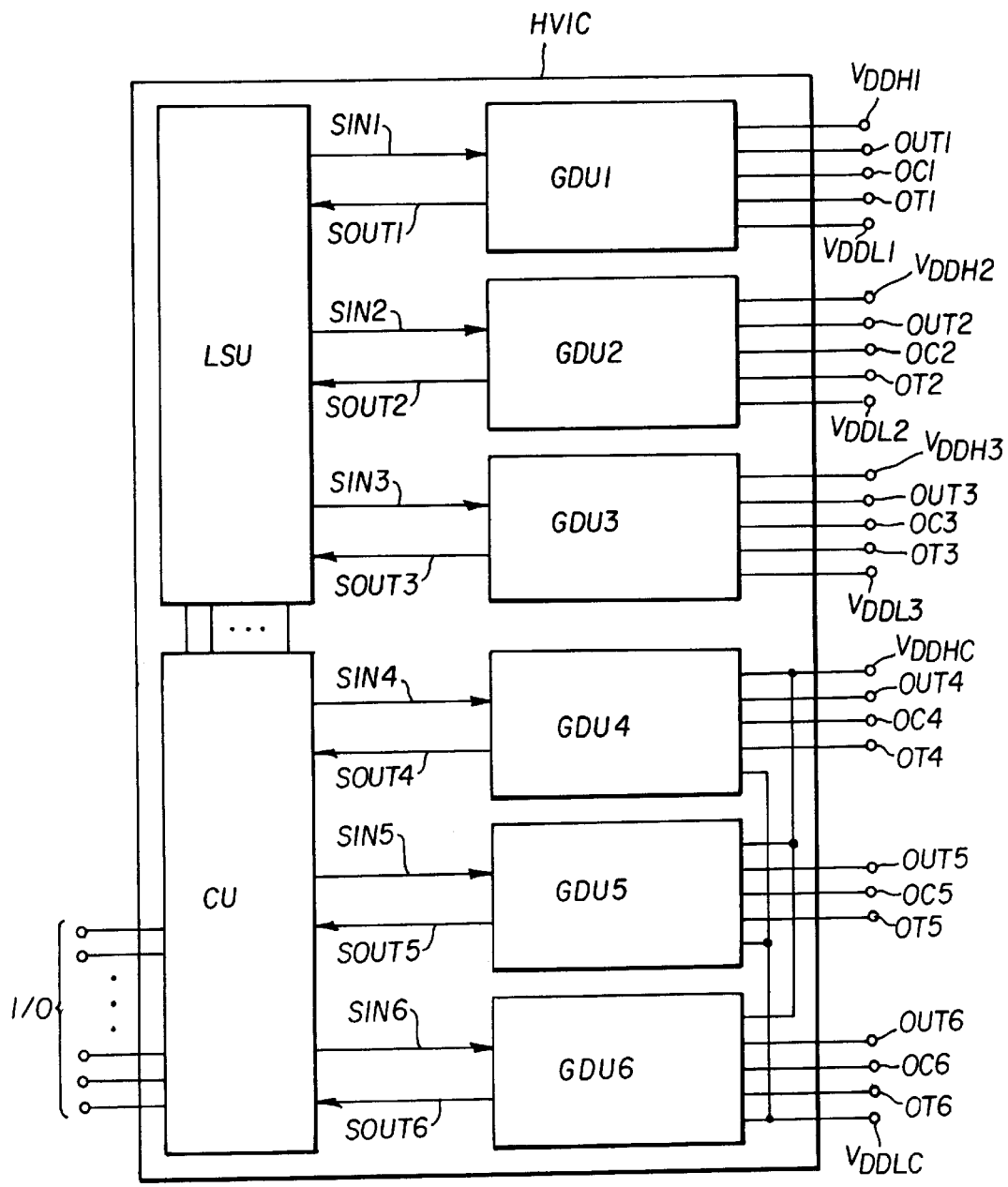
FIG. 34 is a block diagram showing the interior of a high voltage integrated circuit used in the circuit of FIG. 33.
Figure 35:
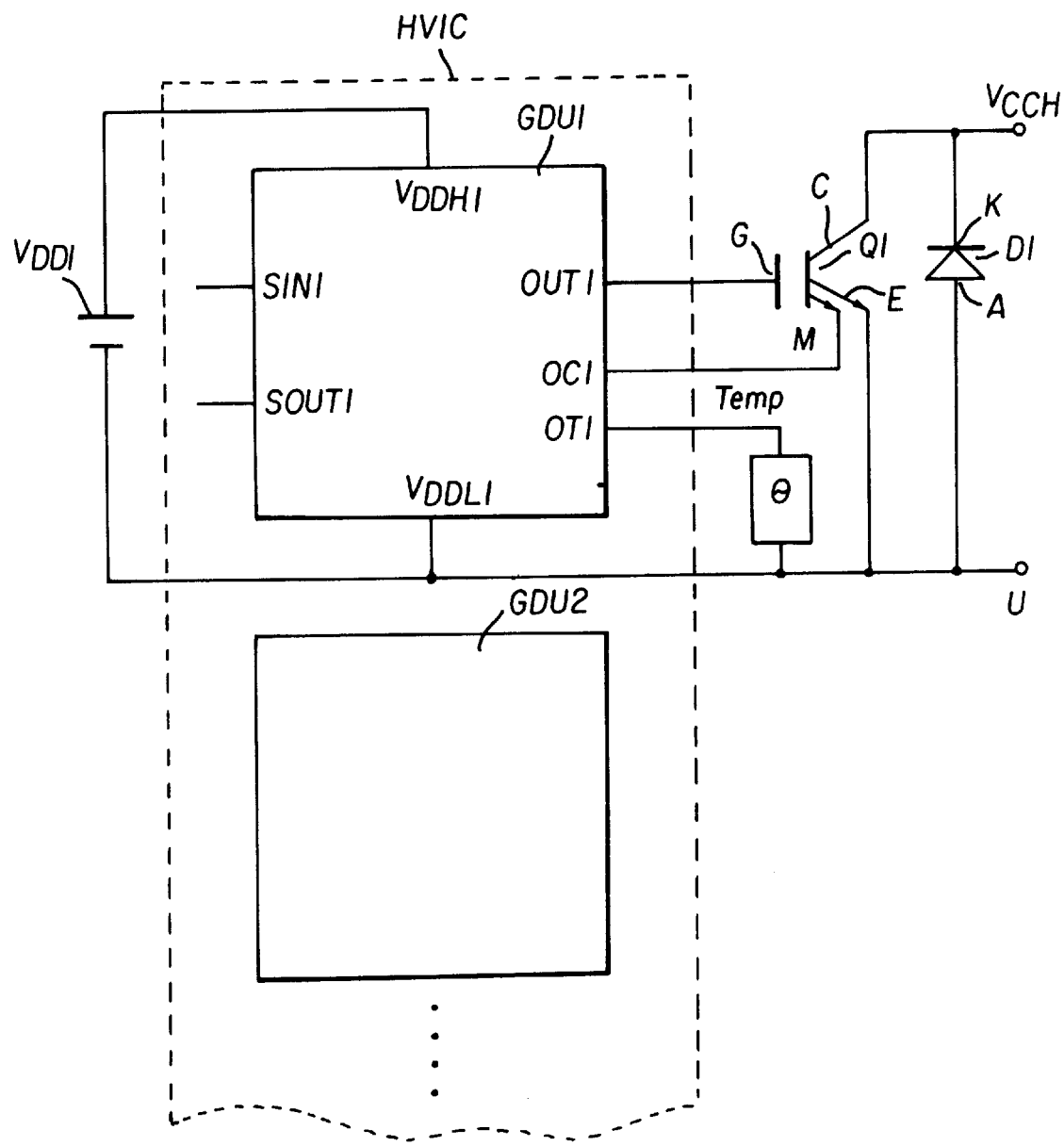
FIG. 35 is a view showing in detail the connection between GDU1 of FIG. 34 and IGBT Q1.
Figure 36:
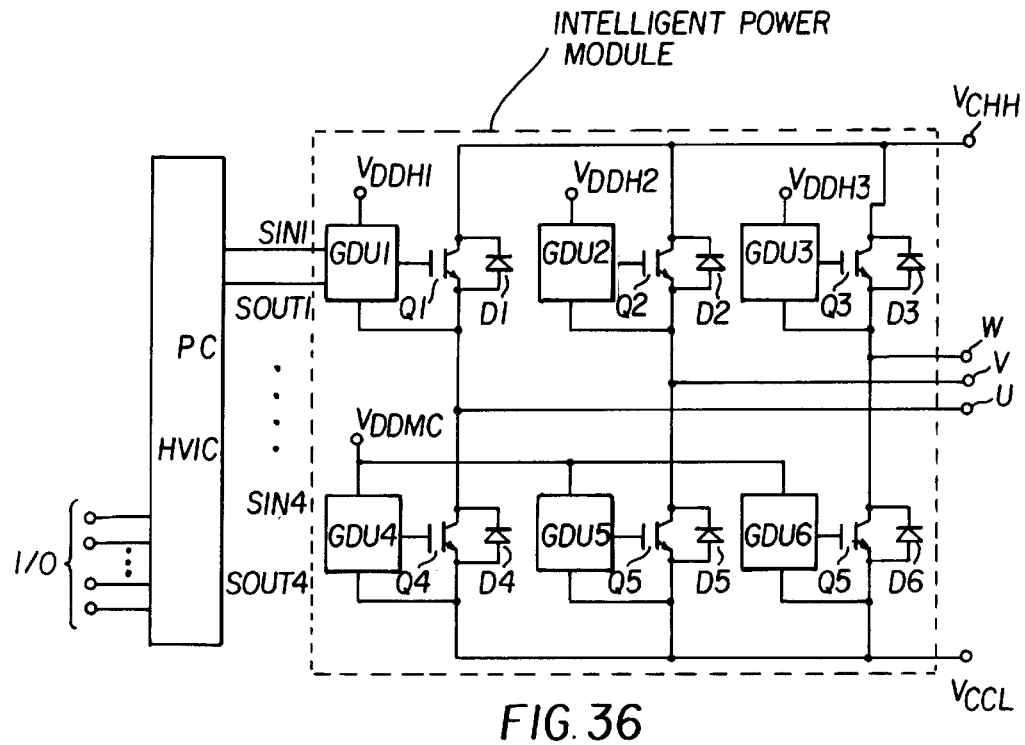
FIG. 36 is a circuit diagram showing a similar circuit to that of FIG. 33, using a product called "intelligent power module"
Figure 37:
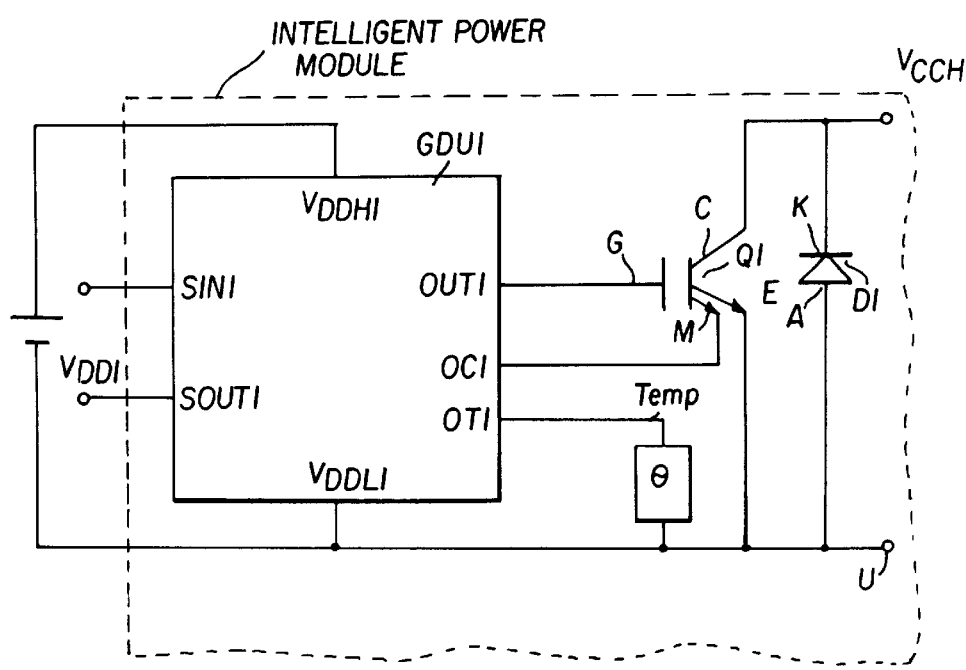
FIG. 37 is a view showing in detail a circuit in the vicinity of the IGBT Q1 of FIG. 36.
Figure 38:
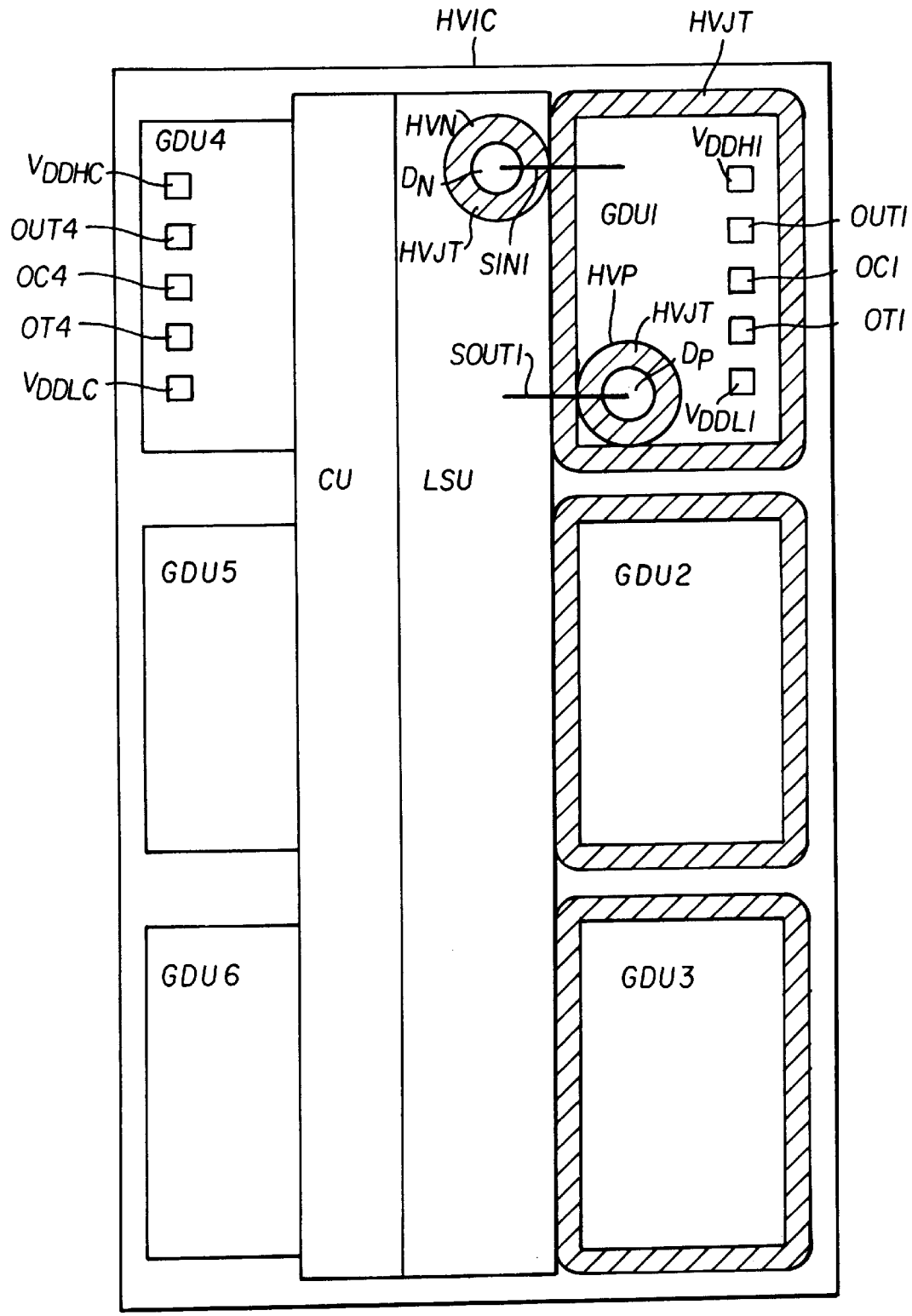
FIG. 38 is a plan view showing a high voltage IC chip as shown in FIG. 34.

In the high voltage IC (HVIC) of FIG. 1 in which the first conductivity type is p type and the second conductivity type is n type, the first region 1 is connected to $V_{DDLC}$ of FIG. 34, namely, $V_{CCL}$ of FIG. 33, and the third region 3 is connected to $V_{DDL1}$ of FIG. 34, namely, the U phase of FIG. 33, while the second region 2 is connected between a drive power source $V_{DD1}$ of about 15V and the output $V_{DDH1}$ on the high potential side. While only the p-channel MOSFET and n-channel MOSFET are shown in the second and third regions 2, 3 in FIG. 1, in the interest of brevity, a multiplicity of various other devices, such as resistor, condenser, diode and bipolar transistor, may be formed on the actual IC, in addition to the MOSFETs, to provide the gate drive unit GDU1 (FIG. 33 and FIG. 35). Then, high voltage n-channel MOSFET (HVN) and high voltage p-channel MOSFET (HVP) constructed as described below are added to the devices, and the input line SINI and output line SOUT1 are formed, as shown in FIG. 38, to provide the high voltage IC as described above referring to FIGS. 33 through 35.

Figure 2A:
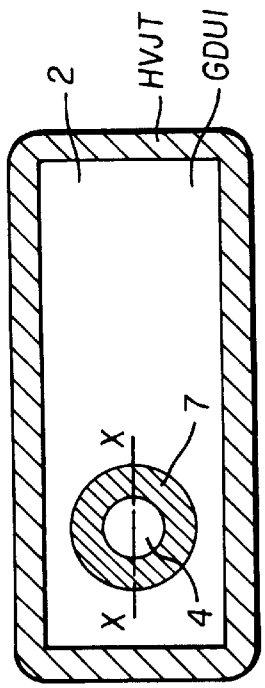
FIG. 2(a) is a plan view showing a principal part of the second embodiment of the present invention, including GDU1 and high voltage junction terminating structure HVJT.
Figure 2B:
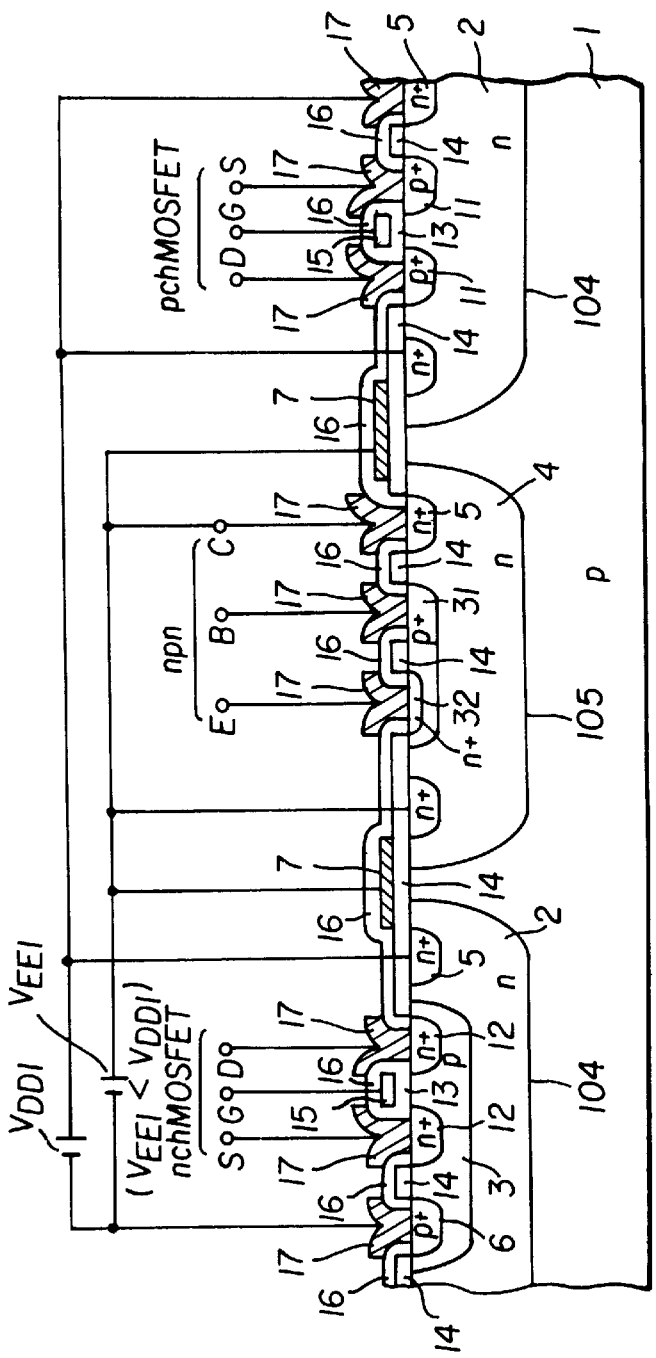
FIG. 2(b) is a cross sectional view taken along line X—X of FIG. 2(a)

FIG. 2 shows a principal part of the second embodiment of the present invention. Specifically, FIG. 2(a) is a plan view of a portion corresponding to GDU1 and high voltage junction terminating structure HVJT of FIG. 38, and FIG. 2(b) is a cross sectional view taken along X—X of FIG. 2(a). In FIG. 2(a), the GDU1 includes second region 2 and fourth region 4 surrounded by the high voltage terminating structure HVJT. In FIG. 2(b), the n-type second region 4 is surrounded by the second region 2 in space-apart relationship, with a loop-like first conductive film 7 formed over both the second and fourth regions 4 through the field insulating film 14. This first conductive film 7 is formed of polycrystalline silicone, and functions in the same manner as the polycrystalline silicone film 15 of FIG. 1. Although only one fourth region 4 is shown in FIG. 2(b), a plurality of (or a multiplicity of) fourth regions may be provided as needed. The fourth region 4 is formed at the same time that the second region 2 is formed, using a mask having a different pattern for implanting phosphorous ions into selected areas of the first region 1. An npn transistor formed in this fourth region 4 includes a base region 31 formed at the same time as the sixth region 6, an emitter region 32 formed at the same time as the n$^+$ region 12, and the second region 2 serving as a connector. The fifth regions 5 are formed in the fourth region 4 for the same reason why the regions 5 are formed in the second region 2. While the p-channel MOSFET (pch MOSFET) and n-channel MOSFET (nch MOSFET) are formed in the second and third regions 2, 3, respectively, various other kinds of devices may be integrated on these regions 2, 3. Further, the p-type region (which is not shown in the figure but will be referred to as seventh region) similar to the third region 3 may be provided in the fourth region 4, and various other kinds of devices may be integrated on the fourth region 4 and seventh region. The fourth region 4 can be utilized as a circuit unit for a power source $V_{EE1}$ different from the drive power source $V_{DD1}$ of the second region 2. The $V_{EE1}$ may be a 10V power source for an analog circuit or a 5V power source for a logic circuit, in which the voltage (15V) of the $V_{DD1}$ is lowered and stabilized. Since the collector (C) as shown in FIG. 2(b) may be used as a bipolar transistor that is independent of the second region 2, the circuit can be designed with a significantly increased degree of freedom, using this fourth region 4.

The conductive film 7 is formed on the surface of a portion of the first region 1 interposed between the second and fourth regions 2, 4, such that the film 7 partially overlaps the second and fourth regions 2, 4, through the field insulating film 14. This arrangement avoids concentration of an electric field due to the fact that the first pn junction 104 between the first region 1 and the second regions 2 to which high voltage is to be applied is isolated or spaced apart from a fourth pn junction 105 between the first region 1 and the fourth region 4, thus assuring high withstand voltage. Preferably, this conductive film 7 is electrically connected with the second or fourth region 2, 4, and potentially stabilized, rather than being in the state of floating. To increase the isolation withstand voltage between the second and fourth regions 2, 4, it is preferable that the first conductive film 7 is connected to a low-potential one of the second and fourth regions 2, 4 when the first conductivity type is p type, and connected to a high-potential one of the second and fourth regions 2, 4 when the first conductivity type is n type. This makes it difficult to turn on a parasitic MOSFET having the first conductive film 7 as a gate.

Figure 3A:
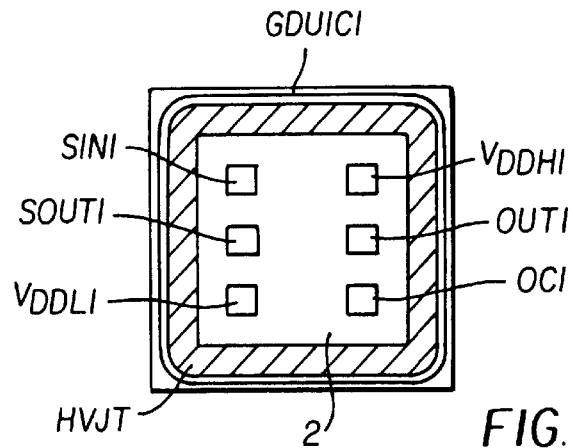
Figure 3B:
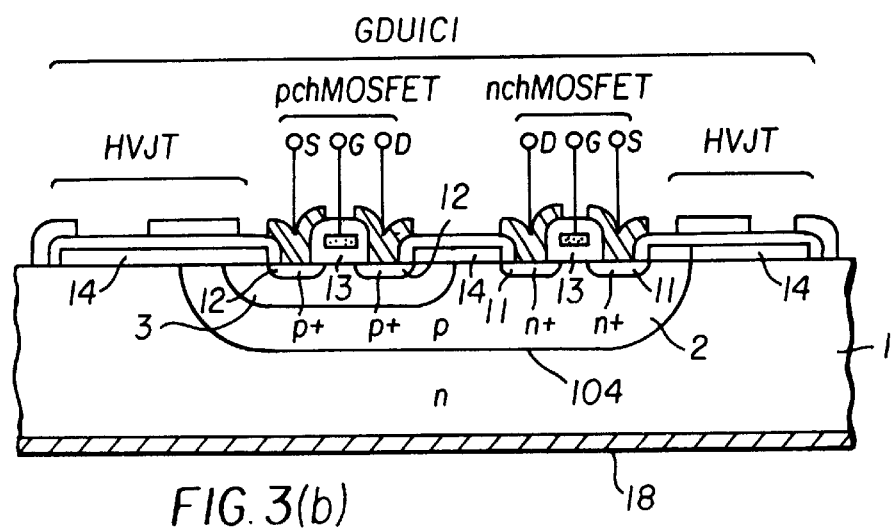
Figure 3C:
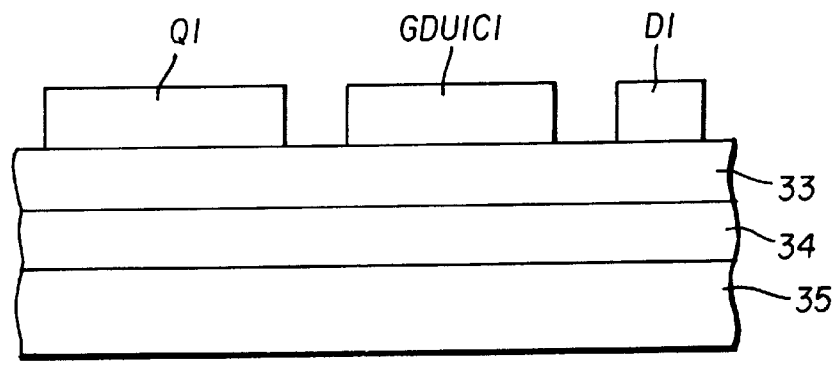

FIG. 3 shows a principal part of the third embodiment of the present invention. FIG. 3(a) is a plan view showing a unit of gate drive circuit formed on one chip, and FIG. 3(b) is a cross sectional view thereof, while FIG. 3(c) is a cross sectional view showing the gate drive unit (formed on one chip) and power devices (e.g., IGBT and diode) formed on a heat sink. In this embodiment, the first conductivity type is n type and the second conductivity type is p type, contrary to those of the previous embodiments.

Figure 6:
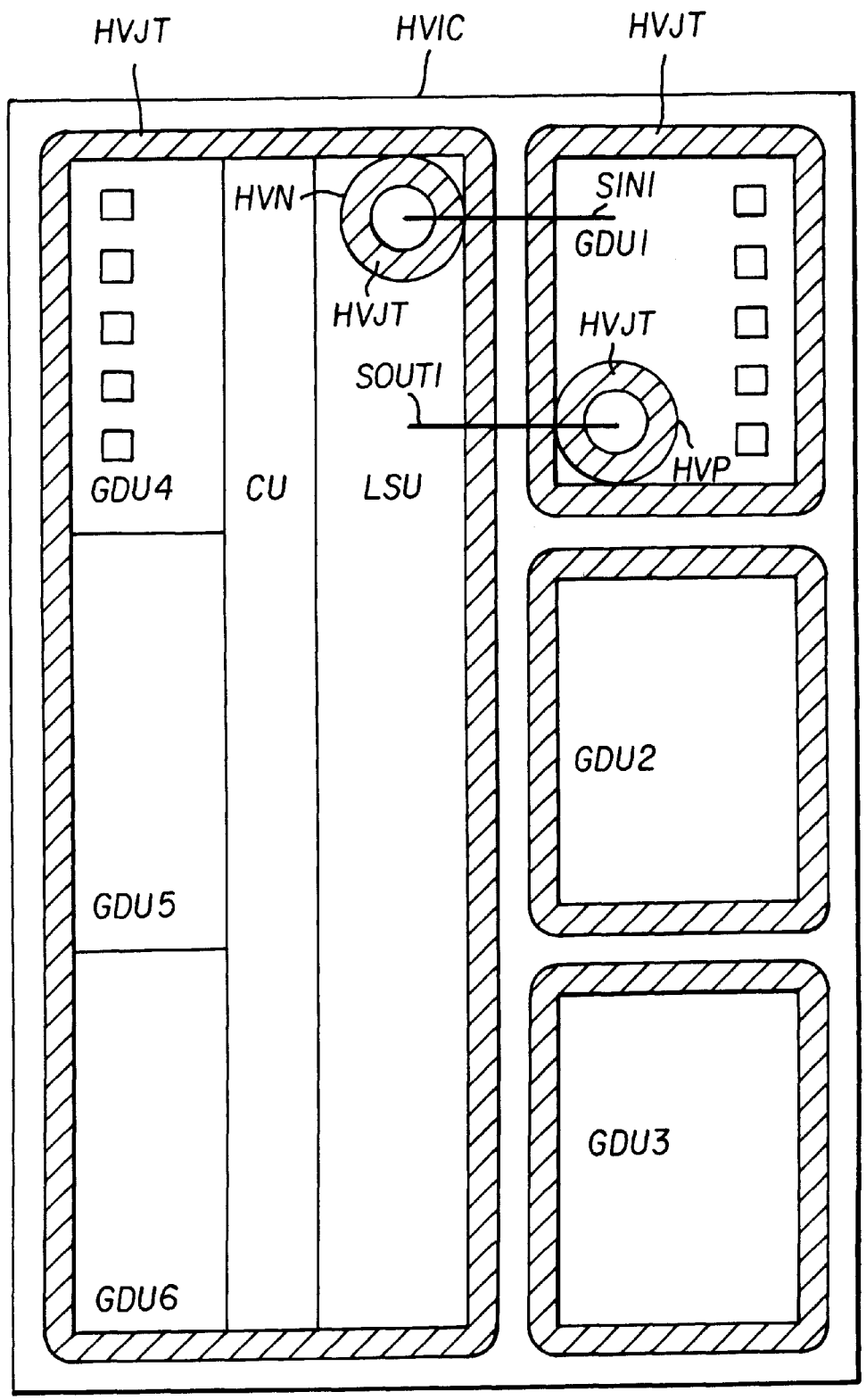
FIG. 6 is a plan view showing a principal part of the sixth embodiment of the present invention.

Referring to FIG. 3(a), a p-type second region 2 formed on an n-type first region 1 is surrounded by a high voltage junction terminating structure HVJT. This plan view of FIG. 3(a) shows a high voltage IC (GDUIC1) in which only the gate drive unit GDU1 of FIGS. 2, 3 and 6 is integrated on one chip.

Referring next to FIG. 3(b), an n-channel MOSFET (nchMOSFET) and a p-channel MOSFET (pchMOSFET) are formed in the p-type second region 2 and an n-type third region 3, respectively, which are formed in the n-type first region 1. Various other kinds of devices other than the second and third regions 2, 3 may be also integrated. On the rear surface of this high voltage IC (GDUIC1), there is provided a second metallic film 18 consisting of three layers of Ti, Ni and Au, for example, such that the metallic film 18 is secured to the rear surface by soldering.

Referring to FIG. 3(c), the high voltage IC (GDUIC1), an n-channel-type vertical power device Q1 (e.g., IGBT) and a diode D1 are secured by soldering to a metal plate 33 that is to be connected to $V_{CCH}$ of FIGS. 33 and 35. In this embodiment where the first conductivity type is n type, the first pn junction 104 between the first and second regions 1, 2 is always reverse biased even if the rear surface of the high voltage IC (GDUIC1) is bonded to the metallic plate 33 to which the rear surface of the power device (collector or drain) is secured. Thus, various devices formed in the second region 2 are electrically insulated from the first region 1, causing no problem in the operation. The metallic plate 33 is disposed on a heat sink 35 made of copper or aluminum, through an insulating plate 34.

Figure 4A:
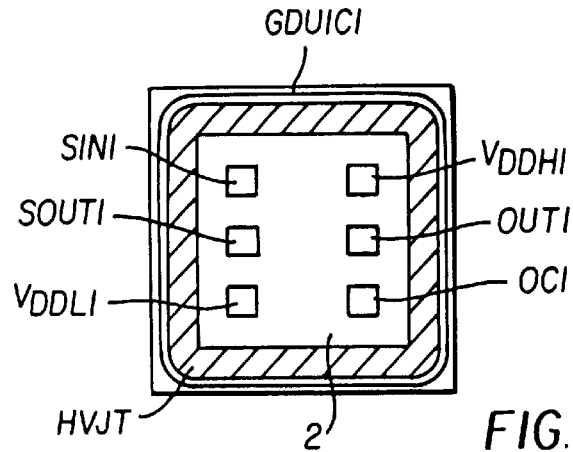
Figure 4B:
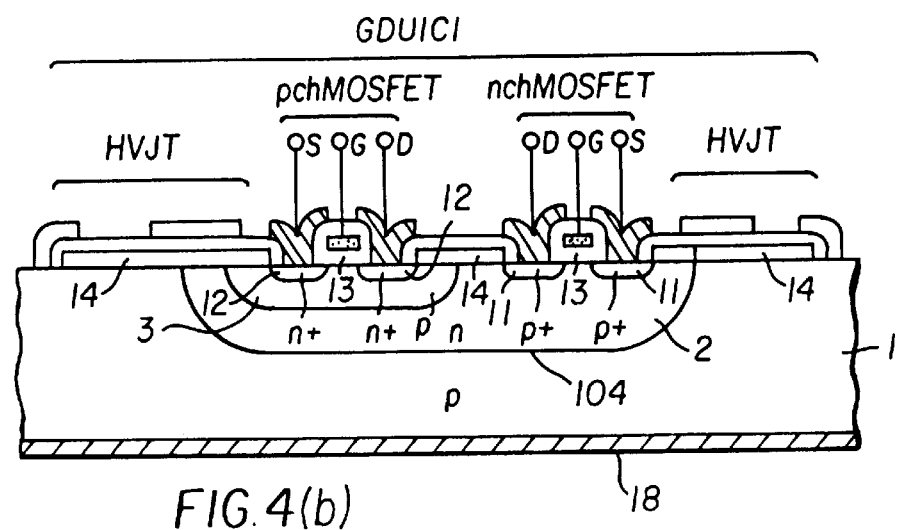
Figure 4C:
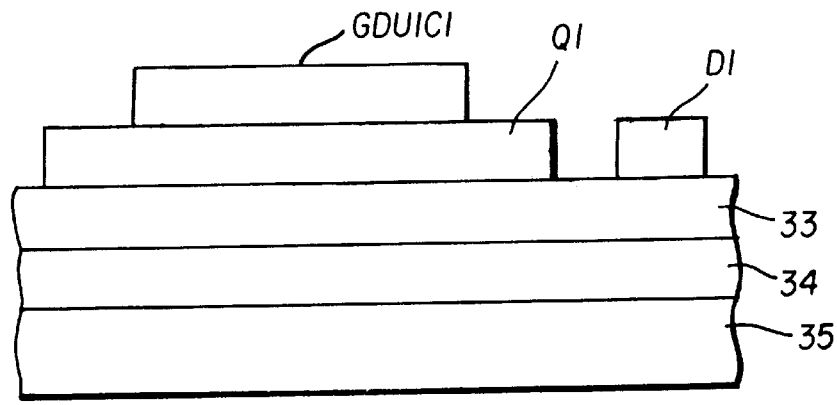

FIG. 4 shows a principal part of the fourth embodiment of the present invention. FIG. 4(a) is a plan view showing GDUIC1 as a high voltage IC wherein only the GDU1 is integrated on one chip, and FIG. 4(b) is a cross sectional view thereof, while FIG. 4(c) is a cross sectional view showing the GDUIC1 secured to an emitter (or source) electrode of the power device Q1. FIG. 4(a) is identical with FIG. 3(a), and therefore will not be explained herein. In FIG. 4(c), the first and third regions 1, 3 are of p type, and the second region 2 is of n type. In FIG. 4(b), the GDUIC1 is secured to the emitter (or source) electrode of the power device Q1, by means of an epoxy containing adhesive, for example. In this case, the first pn junction 104 is always reverse biased if the first conductivity type is p type, causing no problem in the operation.

Figure 5A:
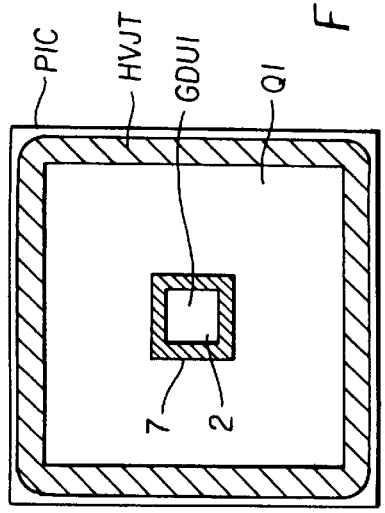
FIG. 5(a) is a plan view showing a principal part of the fifth embodiment of the present invention.
Figure 5B:
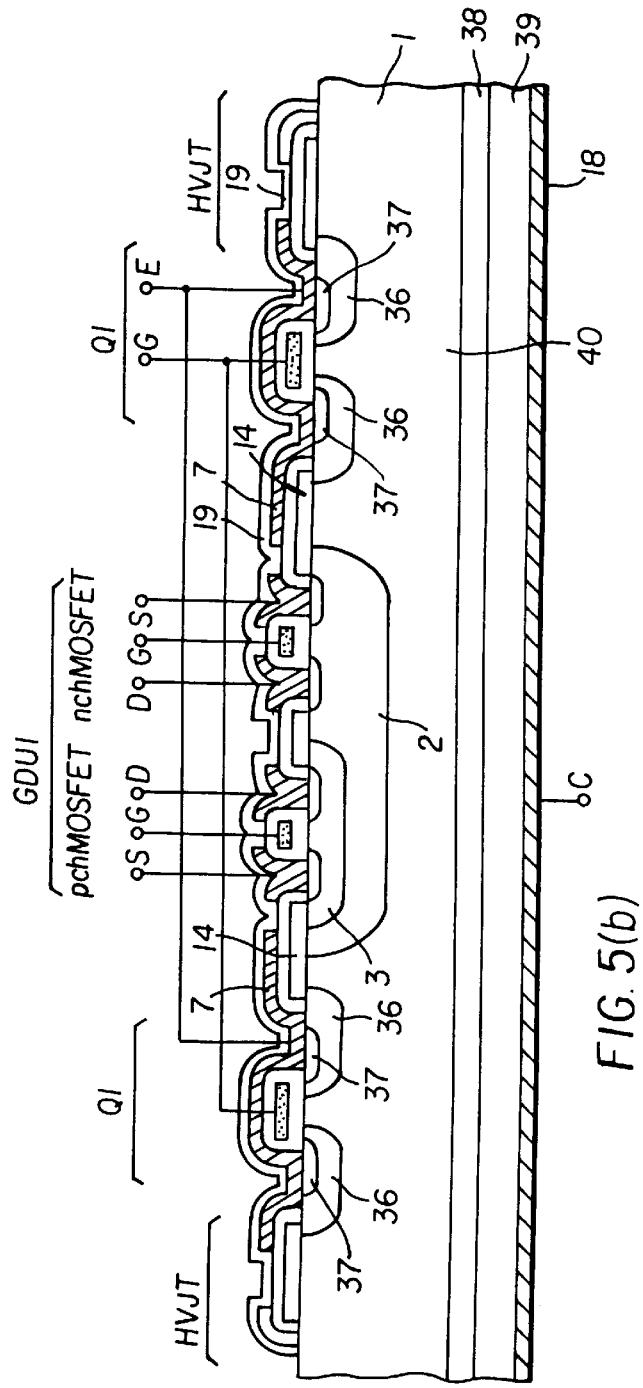
FIG. 5(b) is a cross sectional view thereof.

FIG. 5 shows a principal part of the fifth embodiment of the present invention. FIG. 5(a) is a plan view thereof, and FIG. 5(b) is a cross sectional view thereof.

Referring to FIG. 5(a), an n-channel-type vertical power device Q1 (IGBT in this embodiment) is surrounded by a high voltage junction terminating structure HVJT, and GDU1 is surrounded by this power device Q1.

Referring next to FIG. 5(b), the first region 1 also serves as an n-type drift region 40 of the power device, and the second region 2 formed in a surface layer of the first region 1 is surrounded by a p-type base region 36 of the Q1. The first conductive film 7 is formed on the surface of the first region 1 between the second region 2 and the base region 36 of Q1, through a field insulating film 14. This first conductive film 7 cooperates with an emitter electrode of Q1 to perform the same function as the first conductive film 7 of FIG. 2. This power device Q1 forms IGBT. An $n^+$ buffer layer 38 and a $p^+$ substrate 39 are formed on the second major surface of the first region 1, and a second metallic film 18 is formed on the rear surface of the $p^+$ substrate 39. The peripheral portion of the Q1 is covered with a passivation film 19 (formed from a 100000 Å-thickness silicone nitride film, for example).

Figure 7:
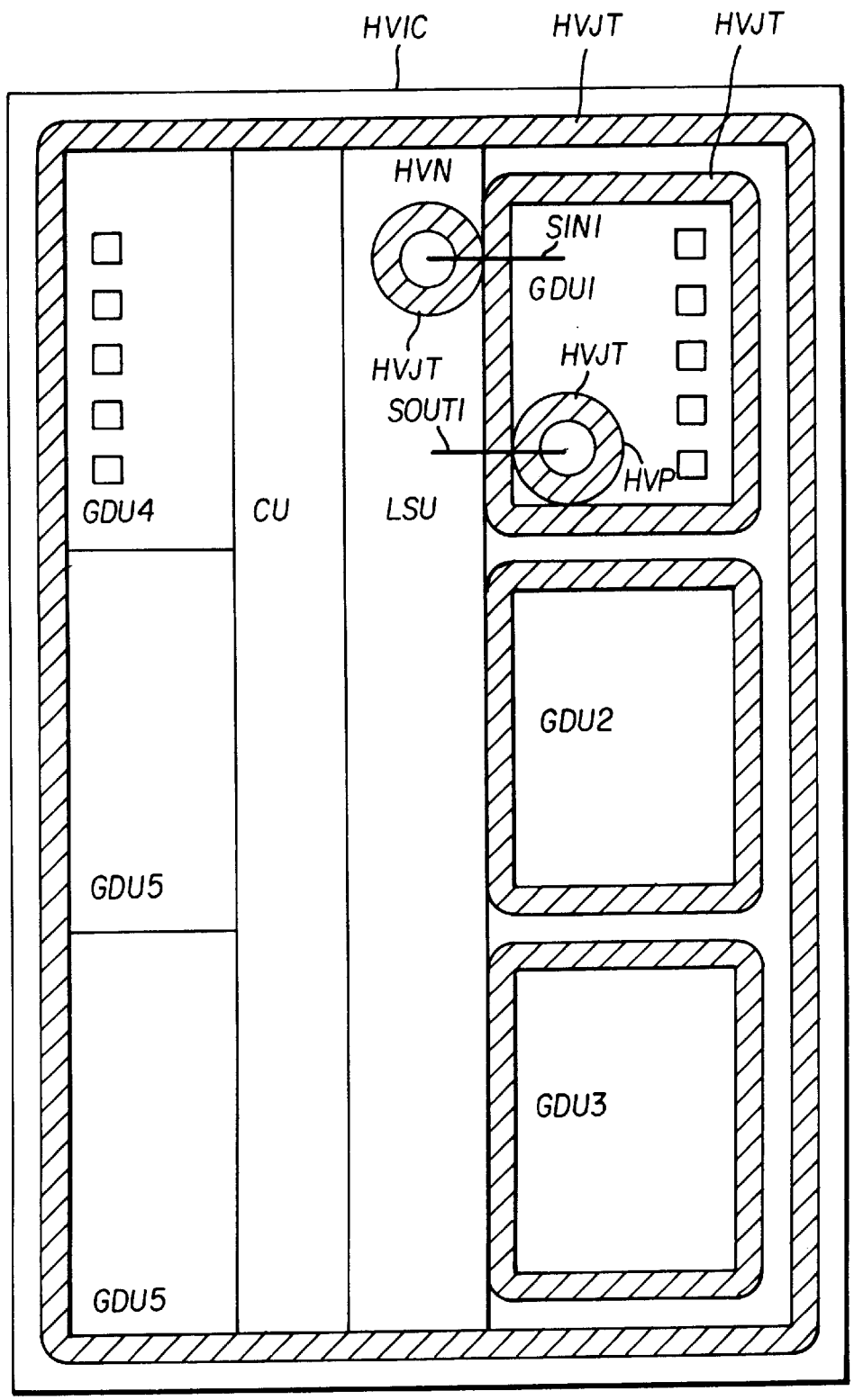
FIG. 7 is a plan view showing a principal part of the seventh embodiment of the present invention.

FIG. 6 is a plan view showing a principal part of the sixth embodiment of the present invention, and FIG. 7 is a plan view showing a principal part of the seventh embodiment of the present invention. While only the GDU1 is shown in FIG. 3, by way of example, the embodiments of FIGS. 6 and 7 correspond to the Ics of FIGS. 34 and 38. In FIG. 6, the high voltage junction terminating structure HVJT surrounds GDU4–GDU6, CU and LSU as a unit. In FIG. 7, the high voltage junction terminating structure HVJT surrounds the circuit unit of FIG. 38 as a whole. Since each of input lines SIN1 and output lines SOUT1 passes a smaller number (2) of high voltage junction terminating structures HVJT in the embodiment of FIG. 7, than that (3) in the embodiment of FIG. 8, the withstand voltage is less likely to be lowered in the embodiment of FIG. 7. Each of the circuit units is constructed as described above, and therefore will not be described herein.

In FIG. 8 and subsequent figures, elements with numbers in parentheses are produced in the same manner and formed at the same time on the same chip as those designated by the same numbers in the embodiments of FIGS. 1–5. In the following description, the first conductivity type is p type, and the second conductivity type is n type. Needless to say, the conductivity type may be reversed.

Figure 8A:
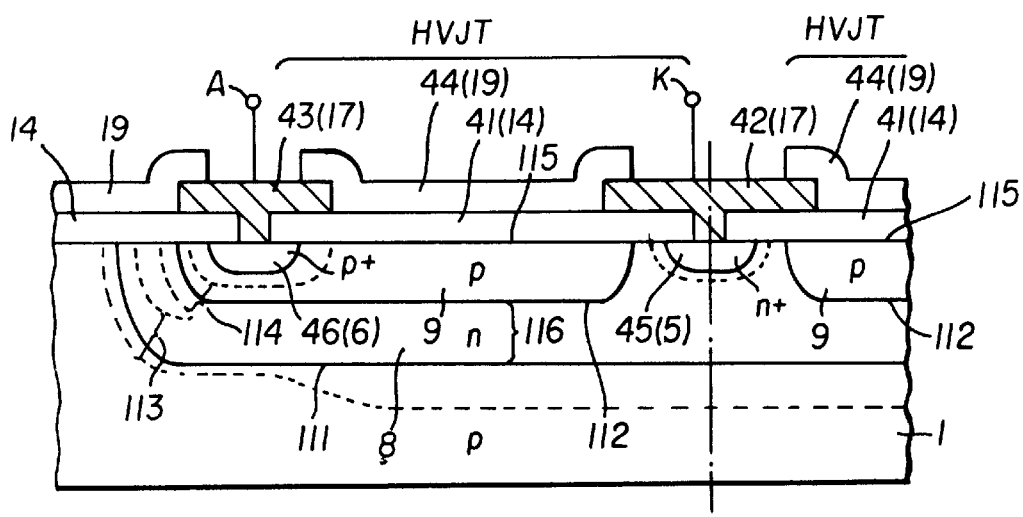
Figure 8B:
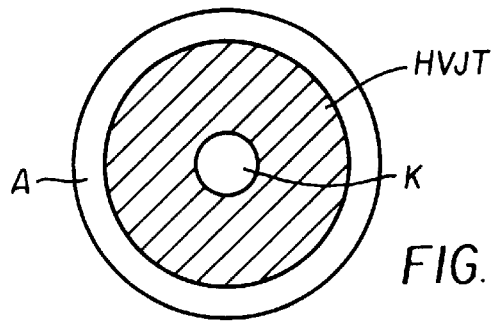
Figure 8C:
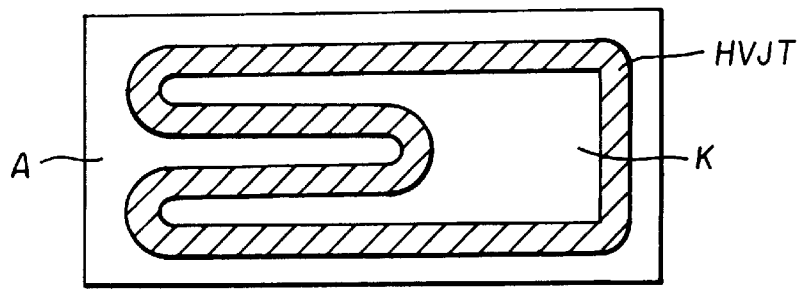

FIG. 8 shows the eighth embodiment of the present invention in which a high voltage junction terminating structure is used with a diode. FIG. 8(a) is a cross sectional view of a principal part of the IC of the eighth embodiment, and FIGS. 8(b) and 8(c) are plan views thereof.

Referring to FIG. 8(a), the first region 1 is a semiconductor substrate doped with boron in a concentration of about $10^{13}$ to $10^{15}$ cm$^{-3}$. The concentration varies depending upon the required withstand voltage. An eighth region 8 is formed by implanting phosphorous ions into a selected area of the surface of the first region 1 in a dose amount of about $3 \times 10^{12}$ to $1 \times 10^{13}$ cm$^{-2}$, and thermally diffusing the ions at 1150° C. for about three to ten hours, such that the diffusion depth is in the range of about 3 to 8 $\mu$m. A ninth region 9 is formed by implanting boron ions into a selected area of the surface of the eighth region 8 in a dose amount of about $1 \times 10^{12}$ to $1.5 \times 10^{13}$ cm$^{-2}$, and thermally diffusing the ions at 1150° C. for about one to five hours, such that the diffusion depth is in the range of about 1.5 to 5 $\mu$m. An $n^+$ region 45 having a high impurity concentration is provided in order to improve electrical connection between a cathode K and the eighth region 8. This region 45 is formed at the same time that the fifth regions 5 shown in FIG. 1 are formed, by implanting phosphorous ions in a selected area of the surface of the eighth region 8 in a dose amount of about $1 \times 10^{14}$ to $1 \times 10^{15}$ cm$^{-2}$, and thermally diffusing the ions at 1000–1100° C. A $p^+$ region 46 having a high impurity concentration is provided in order to improve electrical connection between an anode A and the ninth region 9. This region 46 is formed at the same time that the sixth region 6 shown in FIG. 1 are formed, by implanting boron ions in a selected area of the surface of the ninth region 9 in a dose amount of about $1 \times 10^{14}$ to $1 \times 10^{15}$ cm$^{-2}$, and thermally diffusing the ions at 1000–1100° C. Field insulating film 14 and insulating film 41 on the ninth region 9 are thermal oxide films having a thickness of about 5000 to 10000 Å. The cathode K and anode A are formed from first metallic films 17 made of Al-1% Si, and have a thickness of about 5000 to 10000 Å. Passivation film 19 consists of an amorphous silicone film or a silicone-rich SiN film (nitride film), and has a thickness of about 5000 to 15000 Å. For use as a resistant field plate, a high resistance film 44 is formed on the insulating film 41 on the ninth region 9, in contact with both a second conductive film 42 formed in common with the cathode K, and a third conductive film 43 formed in common with the anode A. The resistivity (sheet resistance) of the high resistance film 44 is about $10_{13}$ to $10_{11} \Omega/\square$. The second and third conductive films 42, 43 extend onto the insulating film 41 on the ninth region 9, to serve as field plates. The net doping amount of a portion 116 of the eighth region 8 located below the ninth region 9 between the ninth region 9 and the first region 1 is set to be in the range of $1 \times 10^{11}$ cm$^{-2}$ to $4 \times 10^{12}$ cm$^{-2}$, and the net doping amount of the ninth region 9 is set to be in the range of $1 \times 10^{11}$ cm$^{-2}$ to $2 \times 10^{12}$ cm$^{-2}$. With the doping amounts thus controlled, when a second pn junction 111 between the first and eighth regions 1, 8 and a third pn junction 112 between the eighth and ninth regions 8, 9 are reverse biased, a second depletion layer spreading out on both sides of the second pn junction 111 and a third depletion layer spreading out on both sides of the third pn junction 112 are merged or combined together within the eighth region 8, and the third depletion layer 114 reaches a surface 115 of the ninth region 9. Namely, in the eighth and ninth regions 8, 9 of the high voltage terminating structure HVJT interposed between the anode A and cathode K, the combined depletion layer (second and third depletion layers 113, 114) reaching the first region 1 spreads out both in the horizontal and vertical directions, with a result of increased withstand voltage. The depletion layer extends in the vertical direction due to a low impurity concentration of the first region 1. The second conductive film 42 is effective to avoid concentration of an electric field around the $n^+$ region 45 having a high impurity concentration, and the third conductive film 43 is effective to avoid concentration of an electric field around the $p^+$ region 46 having a high impurity concentration. The current flowing through the high resistance film 44 between the second and third conductive films 42, 43 gives rise to a smooth potential distribution in the horizontal direction of the film 44. The high resistance film 44 applies the smooth potential distribution therein into a semiconductor region below the insulating film 41, through the capacity of the insulating film 41 on the ninth region 9, so that the potential distribution in the depletion layer of the semiconductor region is smoothly stabilized in the horizontal direction. This is effective to achieve a high withstand voltage with a further reduced horizontal distance of the high voltage junction terminating structure.

FIG. 8 (b) shows the planar arrangement of the high voltage junction terminating structure of FIG. 8(a), in which the cathode, HVJT and the anode are arranged concentrically about a center line indicated by a dashed line in FIG. 8(a). As shown in FIG. 8(b), the high voltage junction terminating structure HVJT interposed between the anode A and the cathode K is in the form of a circular band or loop. This arrangement is suitable for a device having a relatively small active area.

FIG. 8(c) also shows an other typical example of the arrangement of the high voltage junction terminating structure of FIG. 8(a), in which the anode A and the cathode K are shaped like combs so as to be suited for a device having a relatively large active area, and the high voltage junction terminating structure HVJT is in the form of a loop-like band that includes a winding portion extending through th e comb-shaped anode and cathode.

"Loop" referred to in claims 40 and 43 means a generally annular band having a circular or comb-like shape.

Figure 9:
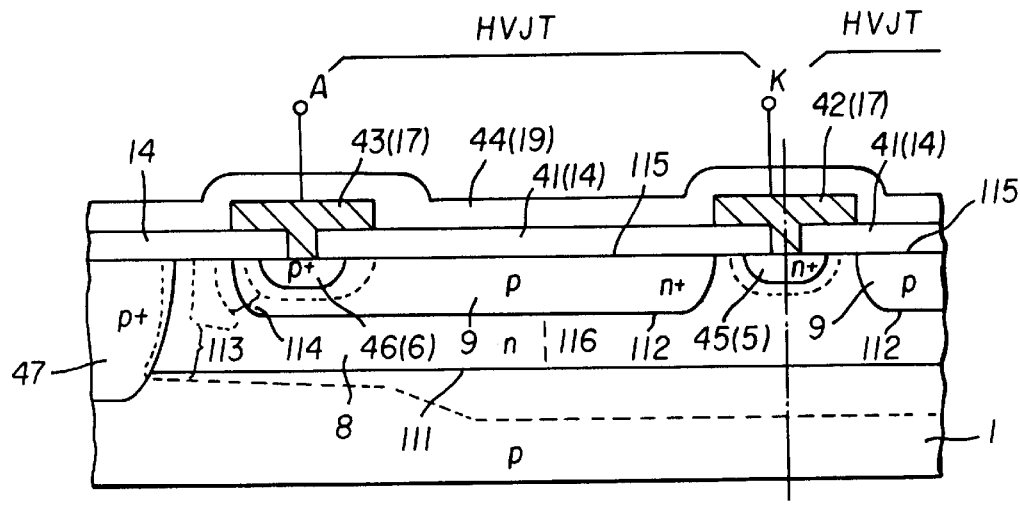
FIG. 9 is a cross sectional view showing a principal part of the ninth embodiment of the present invention.

FIG. 9 shows a principal part of the ninth embodiment of the present invention. In this embodiment, the present invention is applied to the structure of junction isolation conventionally used in high voltage ICs. This embodiment is different from the eighth embodiment of FIG. 8(a) in that the eighth region 8 is formed by epitaxial growth on the first region 1, and a p-type isolating region 47 having a high impurity concentration is formed so as to electrically isolate the eighth region 8 from the other regions. The ninth embodiment is otherwise identical with the eighth embodiment, and the same reference numerals used in FIG. 8(a) are used to identify the corresponding elements in FIG. 9(a). The eighth region 8 formed by epitaxial growth has a thickness of about 5–15 μm, and is doped with phosphorous in an amount of $1 \times 10^{15}$ to $1 \times 10^{16}$ cm$^{-3}$. The isolating region 47 is formed by selectively implanting boron ions in a dose amount of $1 \times 10^{15}$ cm$^{-2}$, for example, and thermally diffusing the ions for about two to ten hours, before the ninth region 9 is formed after the epitaxial growth of the eighth region 8. The cost for manufacturing the present embodiment is higher than that of the embodiment of FIG. 8, due to the formation of the eighth region 8 by epitaxial growth, and the formation of the isolating region 47. Further, high-temperature heat treatment is needed to form the isolating region 47, resulting in a reduced yield due to defects in silicone crystal which may occur upon the high-temperature heat treatment. Even with these disadvantages, the ninth embodiment still has an advantage that the present invention can be applied to such a known technique as junction isolation. The planar arrangements of this embodiment are similar to those as shown in FIGS. 8(b) and 8(c).

Figure 10:
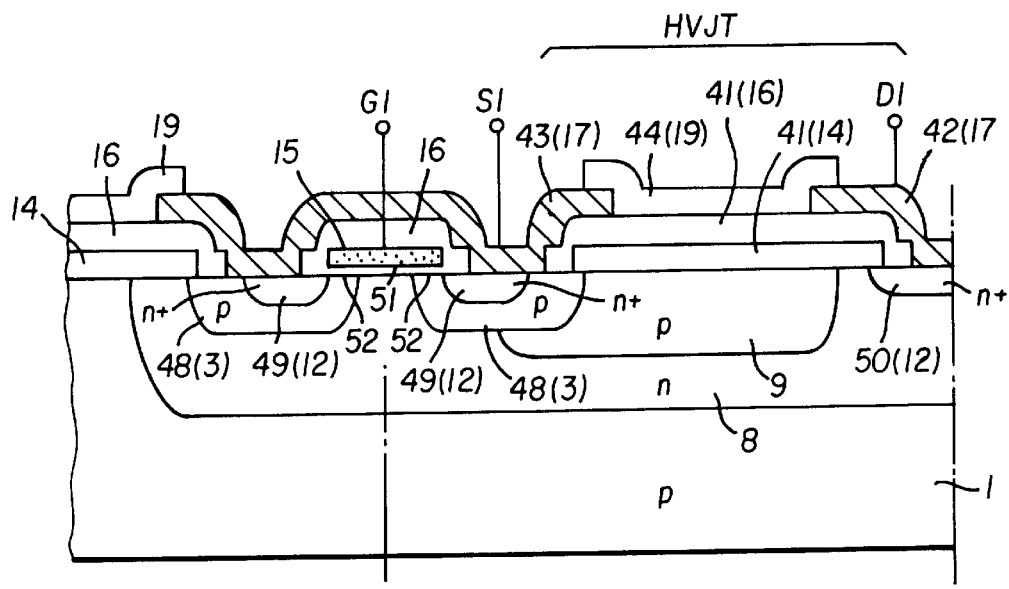
FIG. 10 is a cross sectional view showing a principal part of the tenth embodiment of the invention.

FIG. 10 is a cross sectional view showing a principal part of the tenth embodiment of the present invention. The first region 1, eighth region 8, ninth region 9, field insulating film 14 insulating film 41(14) on the ninth region 9, second conductive film 42 and third conductive film 43, passivation film 19, and high resistance film 44 (19) are identical with those of the eighth embodiment of FIG. 8. The present embodiment differs from that of FIG. 8 in that a first drain electrode D1 (formed in common with the second conductive film 42 in this embodiment) is provided on one side of the high voltage junction terminating structure HVJT, such that the electrode D1 is electrically connected to the eighth region 8, through an n-type region 50 (12) having a high impurity concentration. On the other side of the HVJT, an n-channel high voltage MIS transistor (MOSFET in this embodiment) is provided that includes: a p-type base region 48 electrically connected to the ninth region 9; an n-type source region 49 formed in a selected area of this base region 48 and having a high impurity concentration; an n-channel region 52 formed in the surface of the base region 48 interposed between the eighth region 8 and the source region 49; a first gate insulating film 51 formed on at least the channel region; a third gate electrode G1; and a first source electrode S1 (formed in common with the third conductive film 43 in this embodiment) electrically connected to at least the n-type source region 49. Further, an interlayer insulating film 16 is provided between the third gate electrode G1 and the first source electrode S1 for electrical insulation therebetween, and this insulating film 16 is also used as the insulating film 41 (16) on the ninth region 9. The planar arrangement of this embodiment of FIG. 10 may be a concentric arrangement as shown in FIG. 8(a) in which elements are concentrically arranged about either one of dashed lines of FIG. 10, or a comb-like arrangement as shown in FIG. 8(b) having winding or bent portions aligned with dashed lines of FIG. 10.

Figure 11:
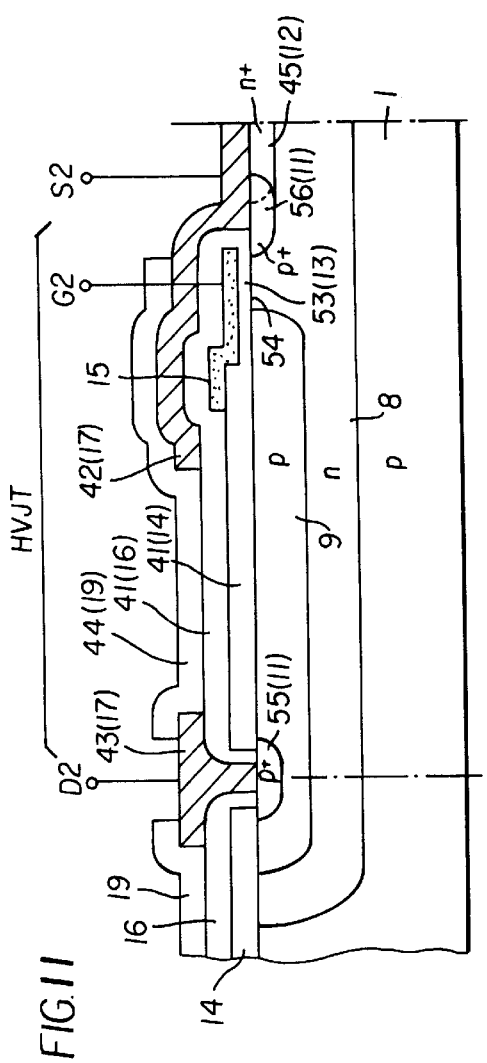
FIG. 11 is a cross sectional view showing a principal part of the eleventh embodiment of the invention.

FIG. 11 is a cross sectional view showing a principal part of the eleventh embodiment of the present invention. The first region 1, eighth region 8, ninth region 9, field insulating film 14, insulating film 41 (14) on the ninth region 9, the second and third conductive films 42, 43, passivation film 19 and high resistance film 44 (19) of the present embodiment are identical with those of the eighth embodiment of FIG. 8. The present embodiment differs from the eighth embodiment in that a p-type source region 56 (11) formed in a selected area of the surface of the eighth region 8, a p-type channel region 54 formed in the surface of the eighth region 8 interposed between the ninth region 9 and the p-type source region 56 (11), a second gate insulating film 53 (13) formed on at least the p-type channel region 54, a fourth gate electrode G2 on this gate insulating film 53 (13), and a second source electrode S2 electrically connected to at least the p-type source region 56 (11) are provided on one side of the high voltage junction terminating structure HVJT. On the other side of the HVJT, there is provided a second drain electrode D2 that is electrically connected to the ninth region 9, through a p-type region 55 (11) having a high impurity concentration.

Figure 12:
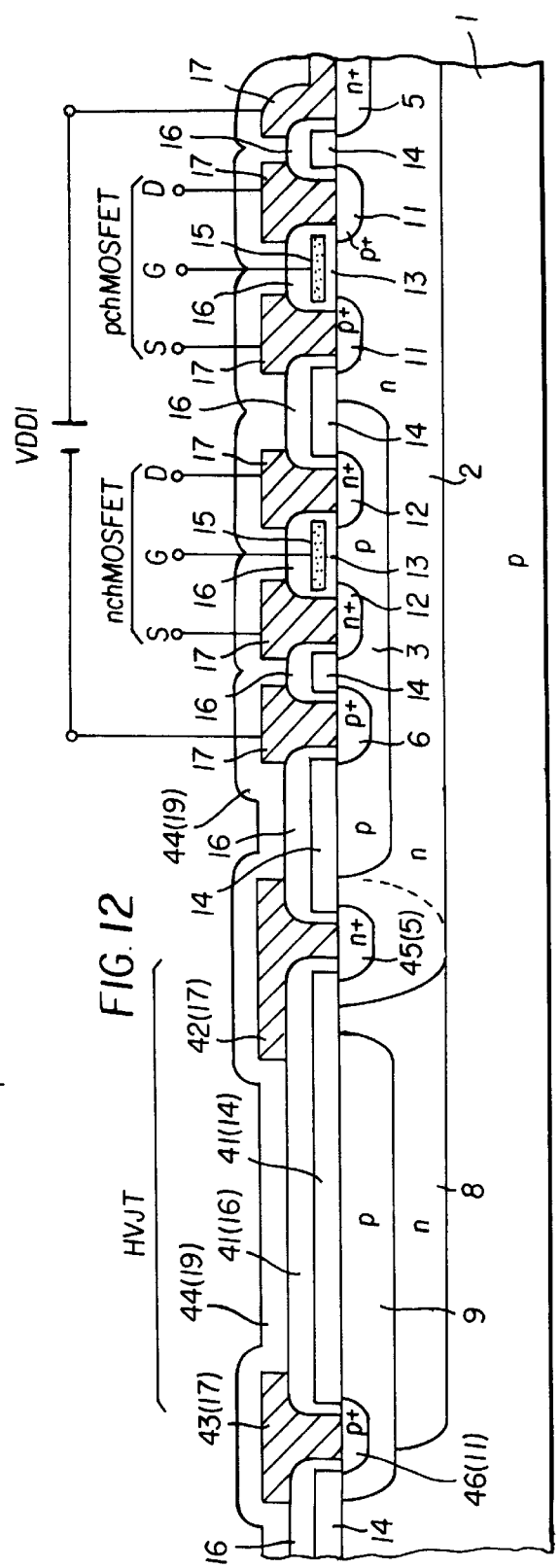
FIG. 12 is a cross sectional view showing a principal part of the twelfth embodiment of the invention.

FIG. 12 is a cross sectional view showing a principal part of the twelfth embodiment of the present invention. After n-type eighth region 8 and n-type second region 2 are formed at the same time in the same diffusion process, a p-type third region 3 is formed in a selected area of a surface layer of the second region 2, and a p-type channel MIS transistor and an n-type channel MIS transistor are formed in the respective surface layers of the second and third regions 2, 3, such that these transistors are surrounded by the high voltage junction terminating structure HVJT. The second region 2 and the eighth region 8 may be connected with each other, to form an integral region. In the following description of the figures, the eighth region will be designated by the reference numeral 8 (2), since the eighth region can be formed in the same process as the second region. An example of the planar arrangement of this embodiment is shown in FIG. 6(a).

Figure 13:
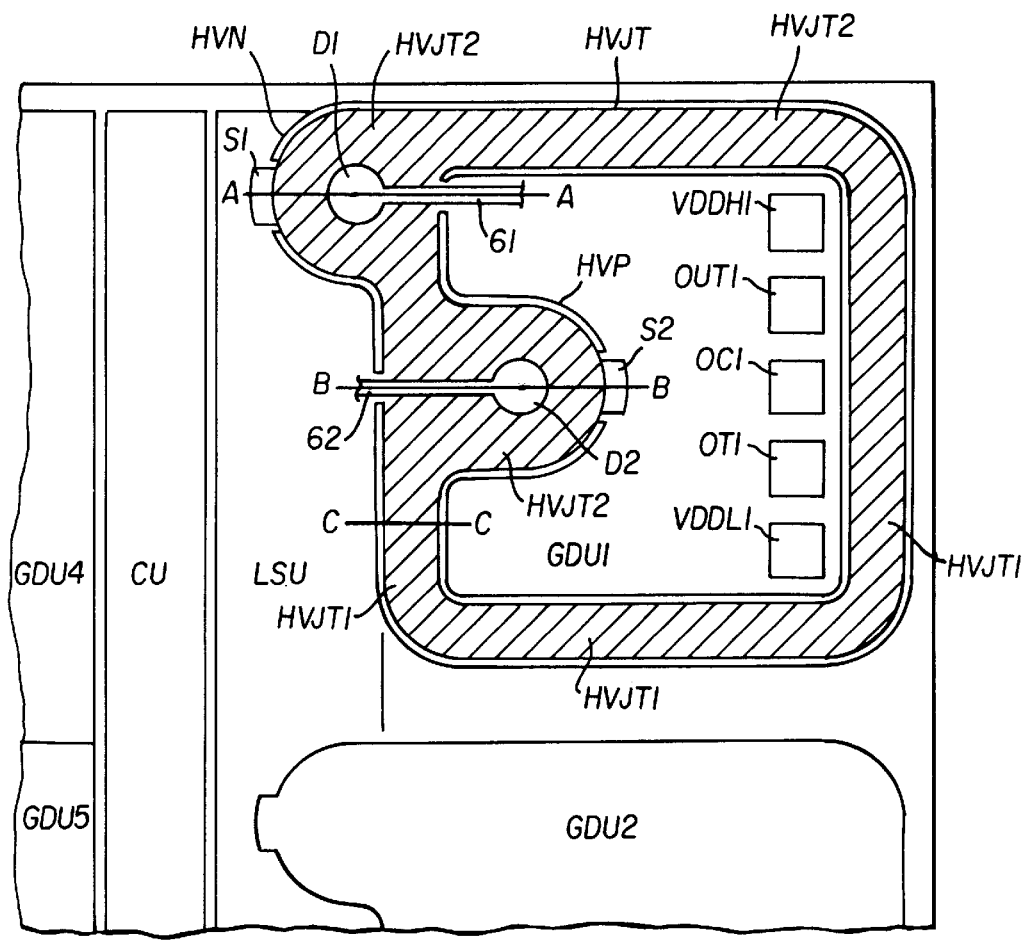
FIG. 13 is a plan view showing a principal part of the thirteenth embodiment of the present invention.

FIG. 13 is a plan view showing a principal part of the thirteenth embodiment of the present invention. This embodiment is different from the conventional example of FIG. 38 in that the first high voltage junction terminating structure HVJT1 surrounding GDU1, and the second high voltage junction terminating structures HVJT2 surrounding lateral MOSFETs formed in the GDU1 and LSU have the same structure, and are integrated together, so as to reduce the strength of electric field under a first output wiring 61 and a second output wiring 62. In this arrangement, a potential difference between the first and second output wirings 61, 62 and the high voltage junction terminating structure HVJT located under these wirings can be reduced as compared with other high voltage junction terminal structures HVJTs. It is therefore possible to reduce the influence of the potential of these output wirings 61, 62 on the potential distribution in the semiconductor surface of the HVJT portion, and thereby prevent reduction of the withstand voltage. In FIG. 13, the same reference numerals as used in FIG. 38 are used to identify the corresponding elements, which will not be described herein. The first output wiring 61 and the second output wiring 62 correspond to SIN1 and SOUT1 of FIG. 38. S1 and S2 denote the first and second source electrodes, and D1 and D2 denote the first and second drain electrodes.

Figure 14:
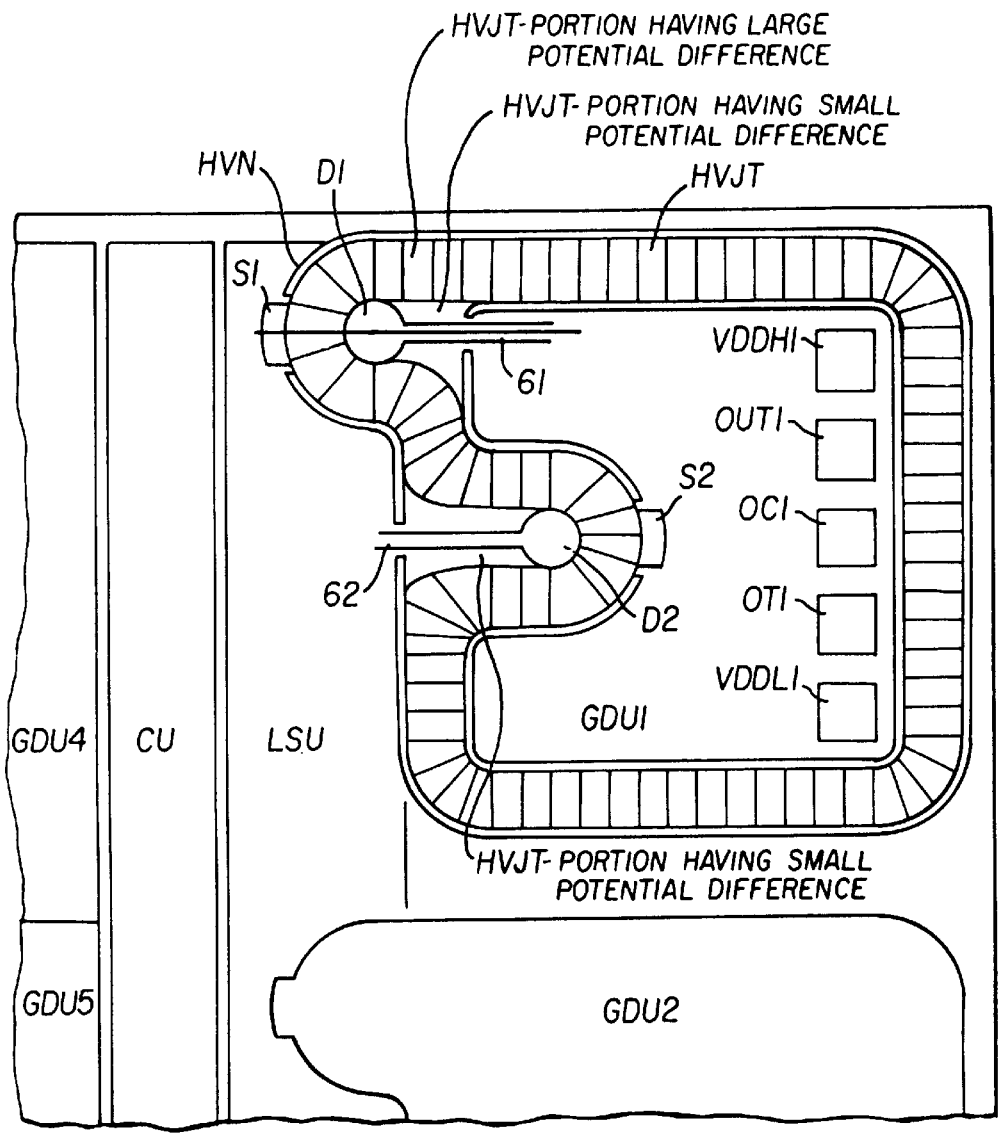
FIG. 14 is a view showing a degree of potential difference in the structure of FIG. 13.

FIG. 14 is a view showing degrees of the potential difference on the plan view of FIG. 13. The potential difference is small around the output wirings 61, 62, and is large at the other portions.

FIG. 15(a) is a cross sectional view of the fourteenth embodiment of the present invention, taken along line A—A of FIG. 13, and FIG. 15(b) is a graph representing the potential distribution thereof.

Figure 16A:
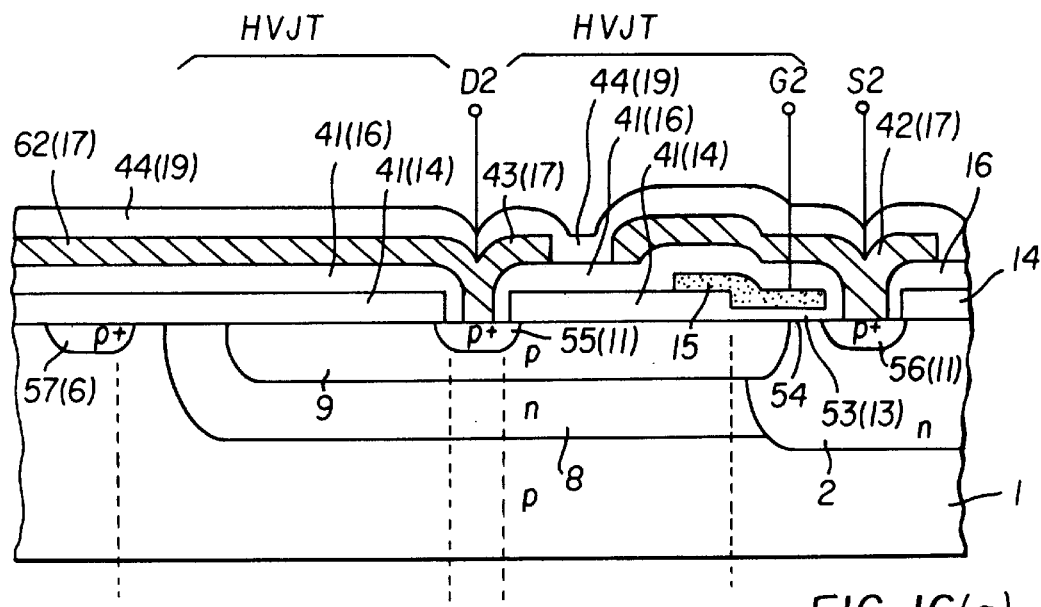
FIG. 16(a) is a cross sectional view of the fourteenth embodiment of the invention, taken along line B—B of FIG. 13.
Figure 16B:
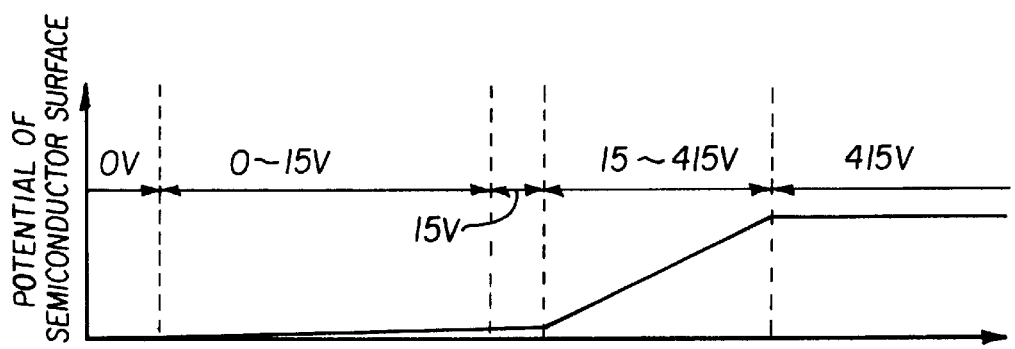
FIG. 16(b) is a graph representing the potential distribution in the structure of FIG. 16(a)

FIG. 16(a) is a cross sectional view of the fourteenth embodiment, taken along line B—B of FIG. 13, and FIG. 16(b) is a graph representing the potential distribution thereof.

FIG. 17(a) is a cross sectional view of the fourteenth embodiment, taken along line C—C of FIG. 13, and FIG. 17(b) is a graph representing the potential distribution thereof.

Referring to FIGS. 15–17, the high voltage junction terminating structure HVJT as shown in FIG. 13 is integrally formed to be commonly used for the GDU1, high voltage n-channel MOSFET (HVN) and high voltage p-channel MOSFET (HVP). In the high voltage junction terminating structure HVJT formed around the drain electrodes D1, D2 of the high voltage n- and p-channel MOSFETs, a high voltage of around 400V is applied to portions of the HVJT which are close to the source electrodes S1, S2, that is, on the left-hand side of D1 in FIG. 15(a) and the right-hand side of D2 in FIG. 16(a), whereas a low voltage of around 15V is applied to portions of the HVJT remote from the source electrodes S1, S2, that is, on the right-hand side of D1 in FIG. 15(a) and the left-hand side of D2 in FIG. 16(a). In this embodiment, the first and second output wirings 61, 62 are arranged so as to pass those portions of the high voltage junction terminating structure HVJT having only a slight potential difference, without causing almost any influence on the potential distribution of the semiconductor region. Thus, the output wirings 61, 62 can be installed without reducing the withstand voltage.

Figure 18:
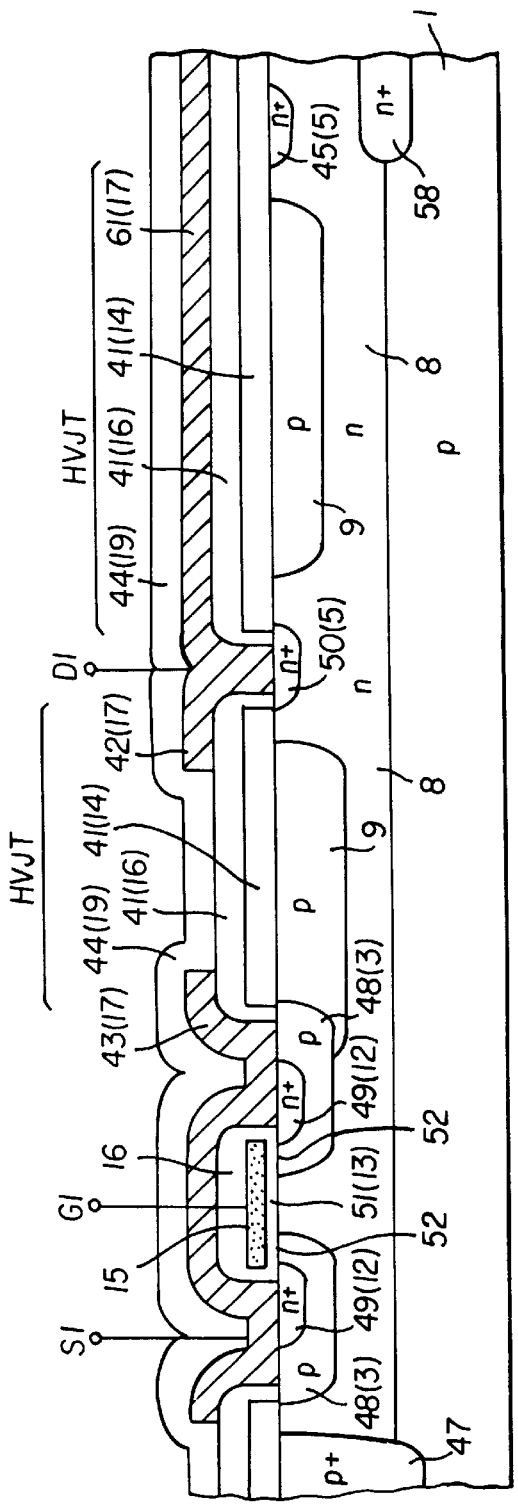
FIG. 18 is a cross sectional view of the fifteenth embodiment of the present invention, taken along line A—A of FIG. 13.
Figure 19:
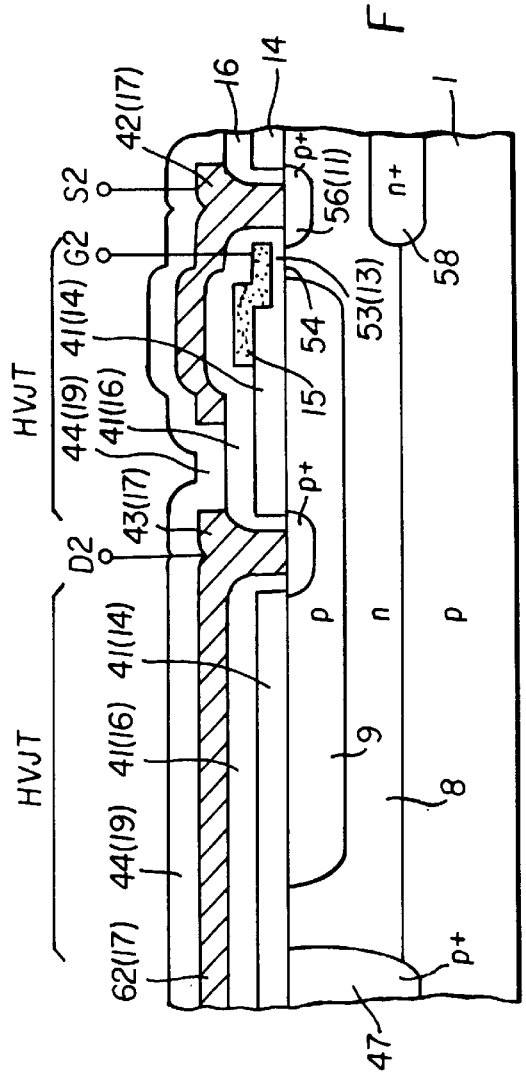
FIG. 19 is a cross sectional view of the fifteenth embodiment of the invention, taken along line B—B of FIG. 13.
Figure 20:
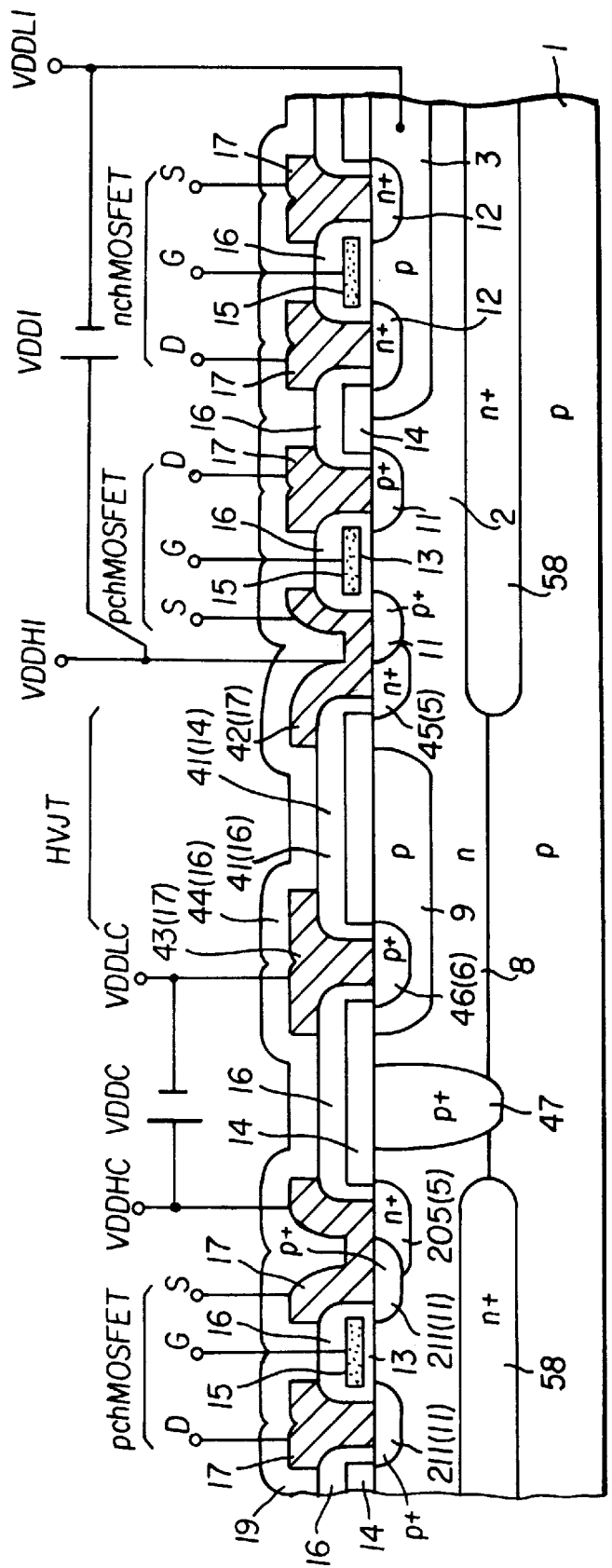
FIG. 20 is a cross sectional view of the fifteenth embodiment of the invention, taken along line C—C of FIG. 13.

FIGS. 18–20 are cross sectional views of the fifteenth embodiment of the present invention, taken along lines A—A, B—B, and C—C of FIG. 13, respectively. This embodiment is a modified example of the fourteenth embodiment.

The present embodiment of FIGS. 18–20 is different from the fourteenth embodiment of FIGS. 15–17, in that an n$^+$ region 58 having a high impurity concentration is embedded in a portion of the semiconductor region (including the first and second regions 1, 2 or 8) that is exposed to high voltage, and a p$^+$ region 47 having a high impurity concentration is formed in contact with the first region 1 in a low-potential semiconductor region on the side of the source electrode S1, so as to enhance the above effects.

The embodiments of FIGS. 21–32 correspond to another embodiment.

Figure 21:
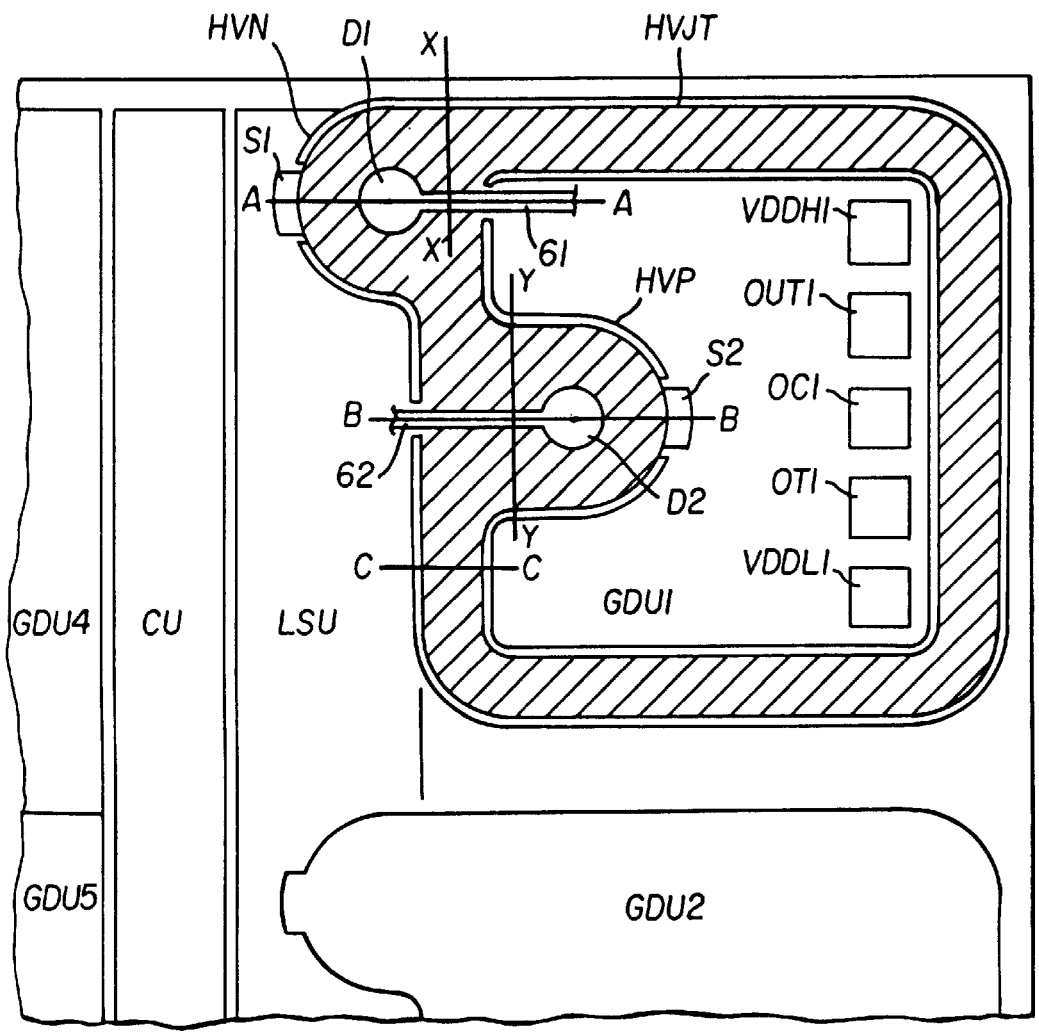
FIG. 21 is a plan view showing a principal part of the sixteenth embodiment of the present invention.

FIG. 21 is a plan view showing a principal part of the sixteenth embodiment of the present invention, which is different from that of FIG. 13 in the planar arrangement of the high voltage junction terminating structure HVJT. In the present embodiment, the HVJT is not provided in the vicinity of the first and second output wirings 61, 62. As described above referring to FIGS. 13–17, the high voltage junction terminating structure HVJT is not necessarily provided in these regions that do not have a large potential difference.

FIGS. 22(a) through 26(a) are cross sectional views of the sixteenth embodiment of FIG. 21, and FIGS. 22(b) through 26(b) show the potential distribution thereof.

FIG. 22(a) is a cross sectional view taken along line A—A of FIG. 21, and FIG. 22(b) shows the potential distribution thereof. The cross section of FIG. 22(a) is different from that of FIG. 15(a) in that the ninth region 9 located below the first output wiring 61 is eliminated, and only the eighth region 8 is provided. As described above, the high voltage junction terminating structure HVJT is not provided in this region in which a large potential difference does not appear.

Figure 23A:
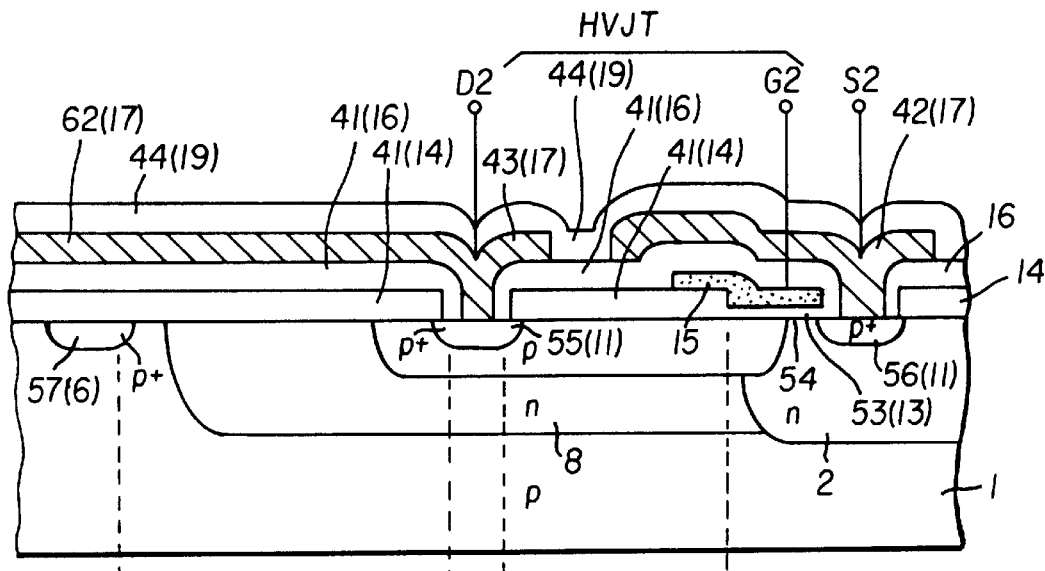
FIG. 23(a) is a cross sectional view of the sixteenth embodiment of the invention, taken along line B—B of FIG. 21.
Figure 23B:
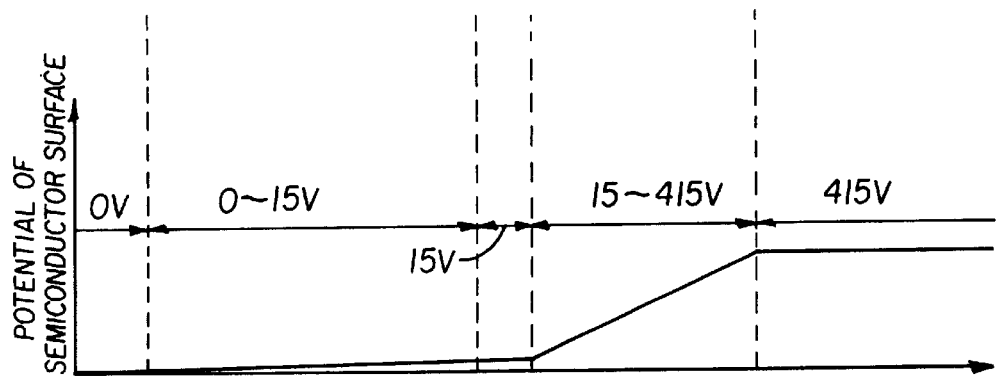
FIG. 23(b) is a graph representing the potential distribution in the structure of FIG. 23(b)

FIG. 23(a) is a cross sectional view taken along line B—B of FIG. 21, and FIG. 23(b) shows the potential distribution thereof. The cross section of FIG. 23(a) is different from that of FIG. 16(a) in that the ninth region 9 located below the second output wiring 62 is eliminated for the same reason as described above with respect to FIG. 22(a).

FIG. 24(a) is a cross sectional view taken along line C—C of FIG. 21, and FIG. 24(b) shows the potential distribution thereof. The cross section of FIG. 24(a) is identical with that of FIG. 17(a), and therefore will not be described herein.

Figure 25A:
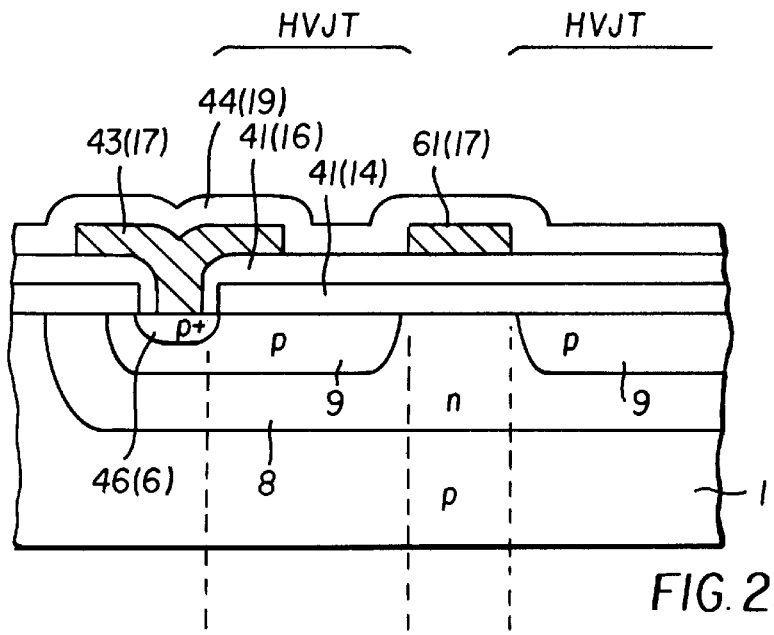
FIG. 25(a) is a cross sectional view of the sixteenth embodiment of the invention, taken along line X—X of FIG. 21.
Figure 25B:
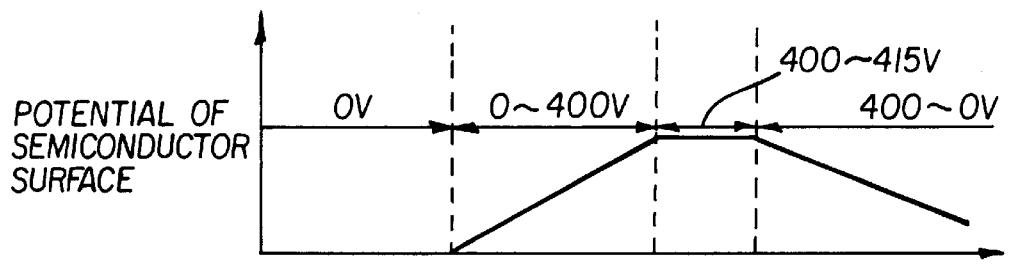
FIG. 25(b) is a graph representing the potential distribution in the structure of FIG. 25(a)

FIG. 25(a) is a cross sectional view taken along line X—X of FIG. 21, and FIG. 25(b) shows the potential distribution thereof. The ninth region 9 is not provided below the first output wiring 61 for the same reason as described above, namely, because a large potential difference does not appear in this region.

Figure 26A:
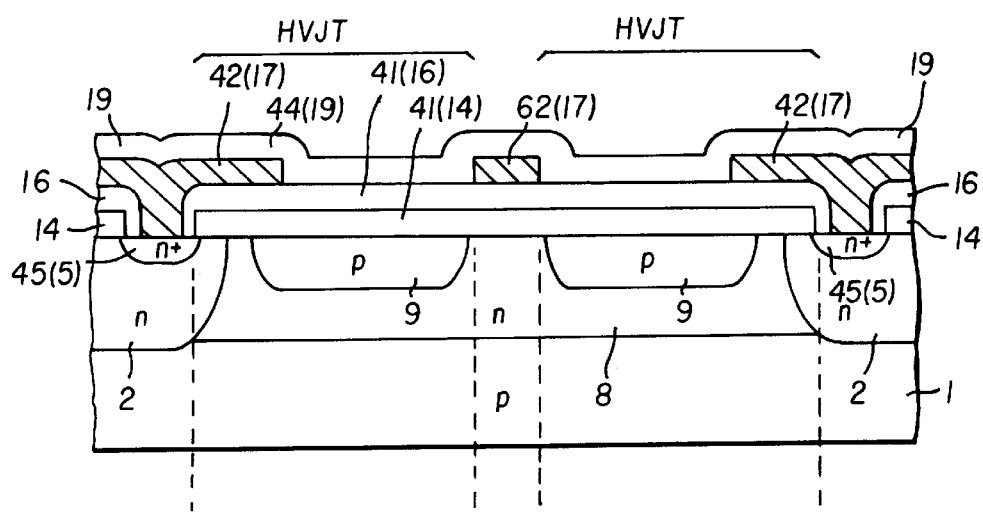
FIG. 26(a) is a cross sectional view of the sixteenth embodiment of the invention, taken along line Y—Y of FIG. 21.
Figure 26B:
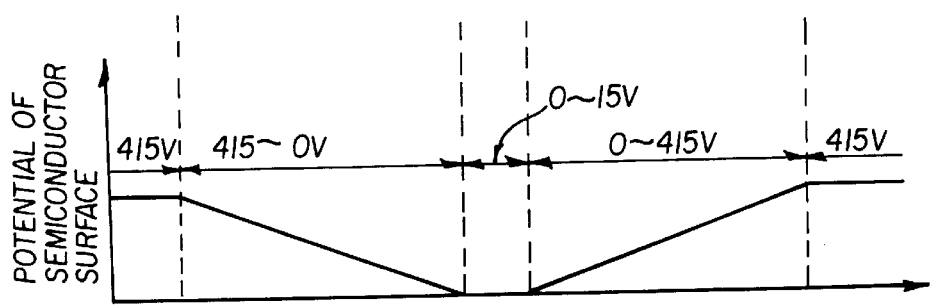
FIG. 26(b) is a graph representing the potential distribution in the structure of FIG. 26(a)

FIG. 26(a) is a cross sectional view taken along line Y—Y of FIG. 21, and FIG. 26(b) shows the potential distribution thereof. The ninth region 9 is not provided below the second output wiring 62 for the same reason as described above, namely, a large potential difference does not appear in this region.

Figure 31A:
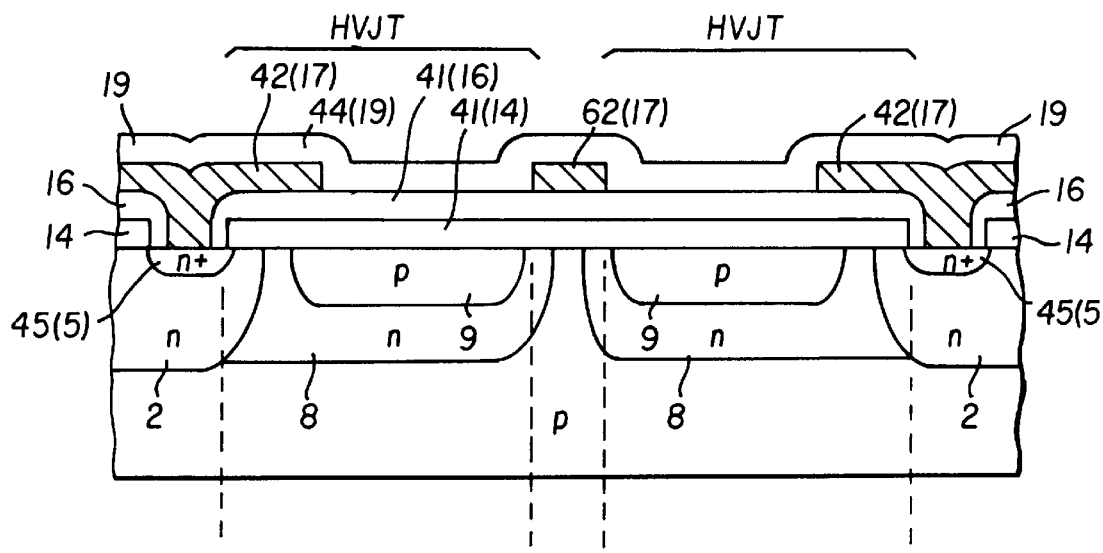
FIG. 31(a) is a cross sectional view of the seventeenth embodiment of the invention, taken along line Y—Y of FIG. 21.
Figure 31B:
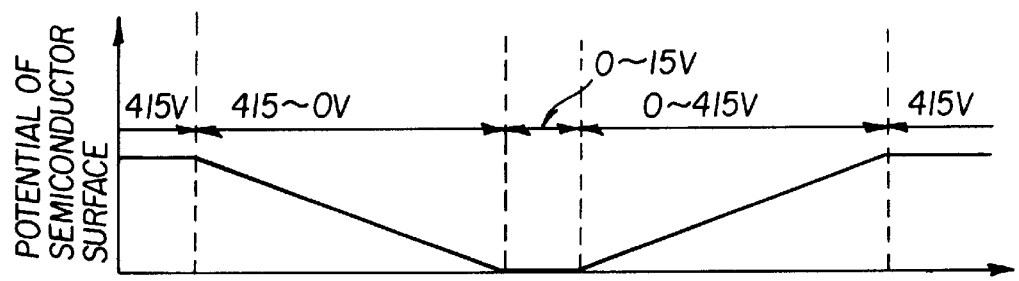
FIG. 31(b) is a graph representing the potential distribution in the structure of FIG. 31(b)

FIG. 27(*a*) through FIG. 31(*a*) are cross sectional views of the seventeenth embodiment of the present invention, and FIG. 27(*b*) through FIG. 31(*b*) show patterns of the potential distribution thereof. The present embodiment is a modified example of the sixteenth embodiment.

FIG. 27(*a*) is a cross sectional view taken along line A—A of FIG. 21, and FIG. 27(*b*) shows the potential distribution thereof. The cross section of FIG. 27(*a*) is different from that of FIG. 22(*a*) in that neither the ninth region 9 nor the eighth region 8 is formed below the first output wiring 61, for the same reason as described above. It should be noted, however, that attentions as described later with respect to FIG. 30 are needed to be paid when both of the eighth and ninth regions 8, 9 are eliminated, with the surface of the first region 1 lying below the first output wiring 61.

Figure 28A:
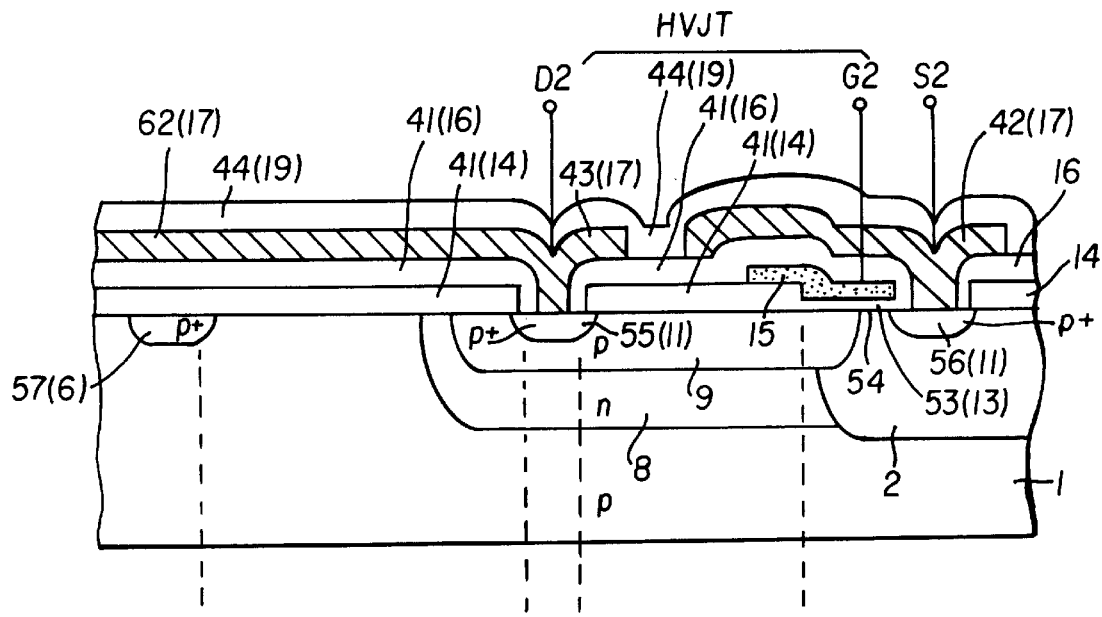
FIG. 28(a) is a cross sectional view of the seventeenth embodiment of the invention, taken along line B—B of FIG. 21.
Figure 28B:
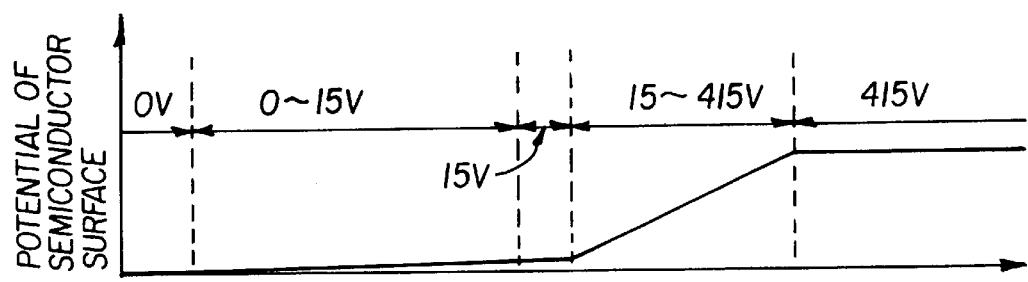
FIG. 28(b) is a graph representing the potential distribution in the structure of FIG. 28(a)

FIG. 28(*a*) is a cross sectional view taken along line B—B of FIG. 21, and FIG. 28(*b*) shows the potential distribution thereof. The cross section of FIG. 28(*a*) is different from that of FIG. 23(*a*) in that neither the ninth region 9 nor the eighth region 8 is formed below the second output wiring 61, for the same reason as described above.

Figure 29A:
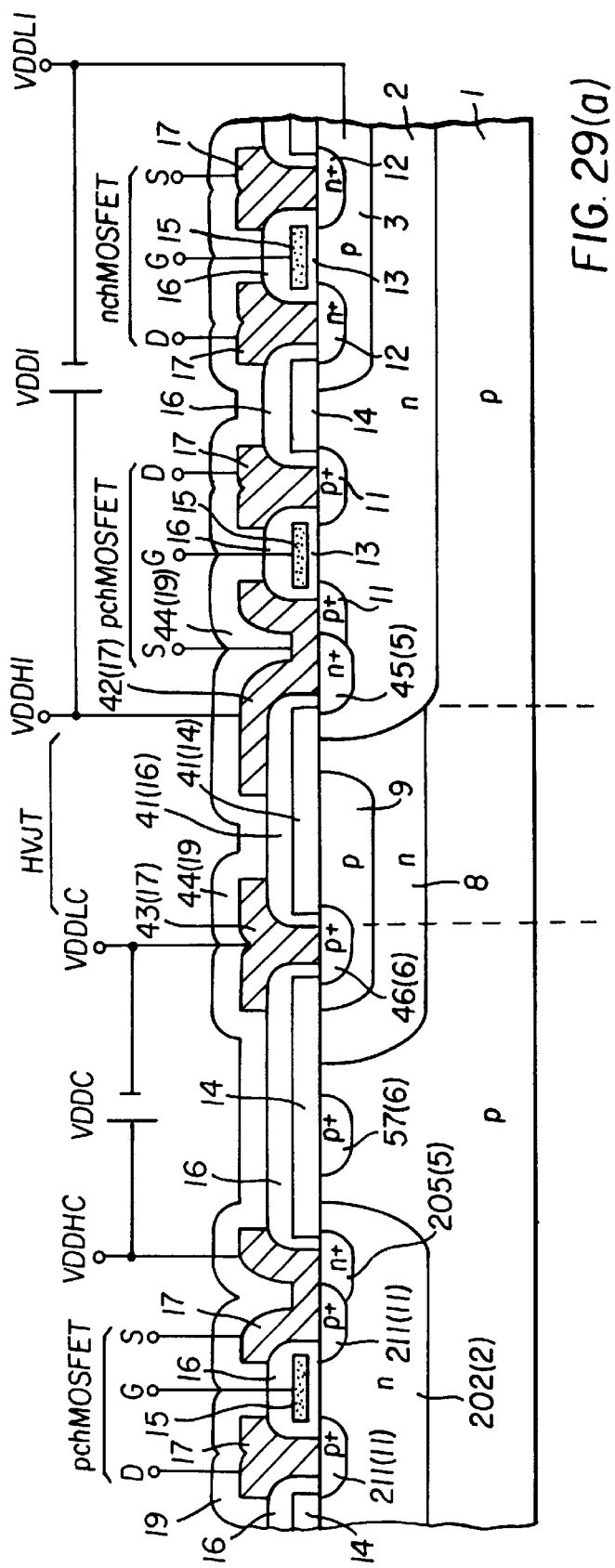
FIG. 29(a) is a cross sectional view of the seventeenth embodiment of the invention, taken along line C—C of FIG. 21.
Figure 29B:
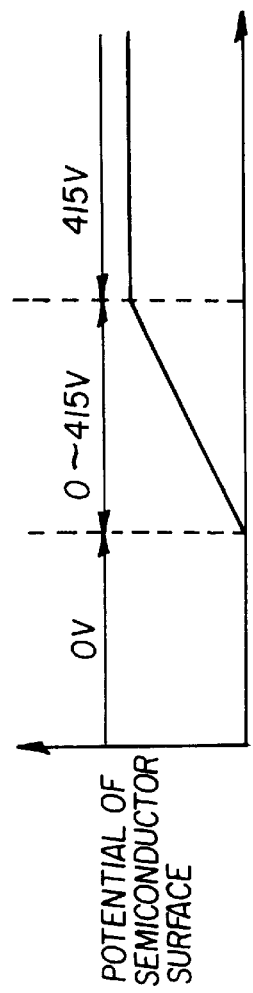
FIG. 29(b) is a graph representing the potential distribution in the structure of FIG. 29(b)

FIG. 29(*a*) is a cross sectional view taken along line C—C of FIG. 21, and FIG. 29(*b*) shows the potential distribution thereof. The cross section of FIG. 29(*a*) is identical with that of FIG. 17(*a*), and therefore will not be described herein.

FIG. 30(*a*) is a cross sectional view taken along line D—D of FIG. 21, and FIG. 30(*b*) shows the potential distribution thereof. Neither the ninth region 9 nor the eighth region 8 is provided below the first output wiring 61, for the same reasons as described above, namely, a large potential difference does not occur in this region. It is to be noted, however, that the first output wiring 61 should fully cover a portion of the first region 1 interposed between the eighth regions 8 and exposed to the surface of the semiconductor substrate, since this portion is potentially stabilized. Otherwise, this portion of the first region 1 may cause reduction of the withstand voltage.

FIG. 31(*a*) is a cross sectional view taken along line Y—Y of FIG. 21, and FIG. 31(*b*) shows the potential distribution thereof. Neither the ninth region 9 nor the eighth region 8 is provided below the second output wiring 62, for the same reason as described above, namely, because a large potential difference does not appear in this region.

Figure 32:
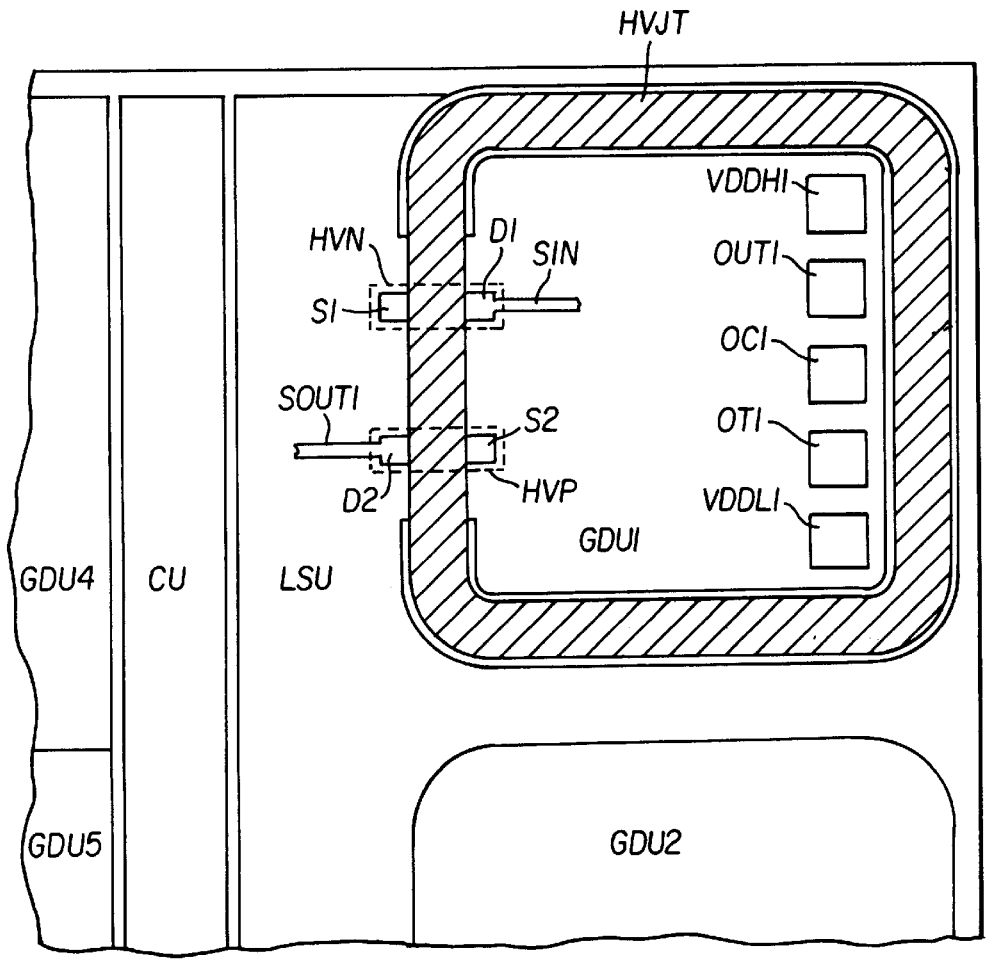
FIG. 32 is a plan view showing a principal part of the eighteenth embodiment of the present invention.

FIG. 32 is a plan view showing a principal part of the eighteenth embodiment of the present invention. In this embodiment, the high voltage junction terminating structure HVJT has a simple loop-like shape, as compared with the HVJTs of FIGS. 13 and 21 having projected and recessed portions as viewed in the planes thereof. The projected and recessed portions are provided to ensure sufficiently large distances between the drain electrode D1 (e.g., FIG. 15) of the high voltage n-channel transistor HVN and the second region 8 (or 2) of the GDU, and between the drain electrode D2 (e.g., FIG. 19) of the high voltage p-channel transistor HVP and the p$^+$ region 57 having a high impurity concentration, so as to reduce parasitic leakage current.

In the embodiment of FIG. 32, on the other hand, the high voltage junction terminating structure HVJT is not provided with projected or recessed portions. Although the present embodiment is advantageous over those of FIGS. 13 and 21 in terms of a reduced area occupied with the high voltage junction terminating structure, this embodiment suffers from an increase in the parasitic leakage current, which results in increased useless power consumption by the high voltage IC. For this reason, the embodiment of FIG. 21 is more suitable for 600V or higher class high voltage IC.

According to the present invention, the second region is formed so that a depletion layer does not reach the third region formed in the surface layer of the second region when the pn junction between the first region and the second region is reverse biased. With the second region thus formed, various devices provided in the third region can be electrically insulated from the first region at a relatively low cost. This junction structure permits the use of the same high voltage junction terminating structure for a plurality of circuit units of different withstand voltages, thus reducing the manufacturing cost. The above junction structure also assures high withstand voltage, which will not be reduced by wiring or lines passing over the high voltage junction terminating structure. The high voltage integrated circuit provided with a temperature detecting portion may be secured to a metallic plate to which a power device or devices is/are secured, or may be integrated along with the power device(s) on the same semiconductor substrate, assuring high accuracy in detecting the temperature of the high voltage IC and power device(s). Thus, the present invention provides a high voltage IC of high performance at a reduced cost.

What is claimed is:

1. A high voltage integrated circuit comprising:
   a first region of first conductivity type;
   a second region of second conductivity type formed in a selected area of a first major surface of said first region;
   a third region of first conductivity type formed in a selected area of a surface of said second region;
   first source region and first drain region of the first conductivity type formed in selected areas of the surface of said second region, apart from said third region;
   a first gate electrode formed on a surface of said second region between said first source region and said first drain region, over an insulating film;
   second source region and second drain region of second conductivity type formed in selected areas of a surface of said third region; and
   a second gate electrode formed on a surface of said third region between said second source region and said second drain region, over an insulating film;
   wherein a net doping amount of said second region interposed between said first region and said third region is in a range of $1\times10^{12}$ cm$^{-2}$ to $3\times10^{13}$ cm$^{-2}$, said net doping amount being obtained by subtracting a doping amount of first-conductivity-type impurities from a doping amount of second-conductivity-type impurities.

2. A high voltage integrated circuit as defined in claim 1, further comprising a high voltage junction terminating structure formed in the shape of a loop to surround an outer periphery of said second region.

3. A high voltage integrated circuit as defined in claim 2, further comprising a fourth region of second conductivity type formed in said first region, apart from said second region, said fourth region being surrounded by the second region.

4. A high voltage integrated circuit as defined in claim 1, wherein said first conductivity type is n type.

5. A high voltage integrated circuit as defined in claim 4, wherein said first region is secured at a second major surface thereof to a metallic plate to which at least one of a collector electrode and a drain electrode of an n-channel vertical power device is secured.

6. A high voltage integrated circuit as defined in claim 4, which is integrated with an n-channel vertical power device on a single semiconductor substrate, said first region being formed in common with an n-type layer of low impurity concentration, including an n-type drift layer or a low concentration n-type drain layer, of the n-channel vertical power device.

7. A high voltage integrated circuit as defined in claim 1, wherein said first conductivity type is p type.

8. A high voltage integrated circuit as defined in claim 7, wherein said first region is secured at a second major surface thereof to a a major surface of an n-channel vertical power device, on which major surface one of an emitter electrode and a source electrode of the n-channel vertical power device is secured.

9. A high voltage integrated circuit as defined in claim 1, wherein said second region is formed by implanting ions of impurity material into the selected area of the first major surface of the first region, and thermally diffusing said impurity material.

10. A high voltage integrated circuit as defined in claim 9, wherein said third region is formed by implanting ions of impurity material into the selected area of the surface of the second region, and thermally diffusing said impurity material.

11. A high voltage integrated circuit as defined in claim 1, wherein said high voltage integrated circuit is operable at supply voltages of at least one hundred volts.

12. A high voltage integrated circuit comprising:
a first region of first conductivity type;
a second region of second conductivity type formed in a selected area of a first major surface of said first region;
a third region of first conductivity type formed in a selected area of a surface of said second region;
a first-conductivity-type-channel MIS transistor comprising first source region and first drain region of first conductivity type formed in selected areas of the surface of the second region, apart from the third region, and a first gate electrode formed through an insulating film on a surface of the second region interposed between the first source region and the first drain region;
a second-conductivity-type-channel MIS transistor comprising second source region and second drain region of second conductivity type formed in selected areas of the surface of the third region, and a second gate electrode formed through an insulating film on a surface of said third region interposed between the second source region and the second drain region;
a first high voltage junction terminating structure surrounding said second region and formed in the shape of a loop;
a second-conductivity-type-channel high voltage MIS transistor including a first drain electrode formed inside the loop of said first high voltage junction terminating structure, and a third gate electrode and a first source electrode formed outside the loop of the first high voltage junction terminating structure; and an output line extending from the first drain electrode onto said second region.

13. A high voltage integrated circuit as defined in claim 12, wherein said first high voltage junction terminating structure comprises:
a first region;
an eighth region of second conductivity type formed in a selected area of a first major surface of said first region, said eighth region and said first region forming a second pn junction therebetween; and
a ninth region of first conductivity type formed in a selected area of a surface of said eighth region, said eighth region and said ninth region forming a third pn junction therebetween,
wherein said eighth region is formed such that a second depletion layer appearing on both sides of said second pn junction is combined with a third depletion layer appearing on both sides of said third pn junction, and said ninth region is formed such that the third depletion layer reaches a surface of said ninth region, when the second and third pn junctions are both reverse biased, and wherein a portion of said eighth region located under said ninth region between said first region and the ninth region has a net doping amount of $1\times10^{11}$ $cm^{-2}$ to $4\times10^{12}$ $cm^{-2}$, and the ninth region has a net doping amount of $1\times10^{11}$ $cm^{-2}$ to $2\times10^{12}$ $cm^{-2}$.

14. A high voltage integrated circuit comprising:
a first high voltage junction terminating structure formed in a shape of a loop;
at least a MIS transistor formed inside said loop of said first high voltage junction terminating structure; and
a high voltage MIS transistor having a drain electrode on one side of said loop of said first high voltage junction terminating structure and a gate electrode and a source electrode on another side of said loop of said first high voltage junction terminating structure.

15. A high voltage integrated circuit comprising:
a first high voltage junction terminating structure formed in a shape of a loop;
at least a MIS transistor formed inside said loop of said first high voltage junction terminating structure; and
a second-conductivity-type-channel high voltage MIS transistor having a first drain electrode inside said loop of said first high voltage junction terminating structure and a third gate electrode and a first source electrode outside said loop of said first high voltage junction terminating structure.

16. A high voltage integrated circuit comprising:
a first high voltage junction terminating structure formed in a shape of a loop;
at least a MIS transistor formed inside said loop of said first high voltage junction terminating structure; and
a first-conductivity-type-channel high voltage MIS transistor having a second drain electrode outside said loop of said first high voltage junction terminating structure and a fourth gate electrode and a second source electrode inside said loop of said first high voltage junction terminating structure.

* * * * *